United States Patent
Sasagawa et al.

(10) Patent No.: US 6,412,100 B1
(45) Date of Patent: Jun. 25, 2002

(54) METHOD FOR SOLVING A LAYOUT OPTIMIZATION PROBLEM, AND COMPUTER-READABLE RECORDING MEDIUM HAVING A LAYOUT OPTIMIZATION PROBLEM PROCESSING PROGRAM RECORDED THEREON

(75) Inventors: Fumiyoshi Sasagawa; Akio Shinagawa, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/358,925

(22) Filed: Jul. 23, 1999

(30) Foreign Application Priority Data

Sep. 11, 1998 (JP) .......................................... 10-258334

(51) Int. Cl.[7] .............................................. G06F 17/50
(52) U.S. Cl. ................................. 716/9; 716/2; 703/11
(58) Field of Search ............................... 716/1, 2, 8, 9, 716/10; 703/11

(56) References Cited

U.S. PATENT DOCUMENTS 5,557,533 A * 9/1996 Koford et al. ............... 364/491
5,682,322 A * 10/1997 Boyle et al. ................. 364/491
5,914,887 A * 6/1999 Scepanovic et al. ........ 364/491

FOREIGN PATENT DOCUMENTS

JP          11-134315          5/1999

OTHER PUBLICATIONS

Esbensen et al., "SAGA:A Unification of the Genetic Algorithm with Simulated Annealing and its Application to Macro-Cell Placement," 7ty Int'l Conference on VLSI Design, Jan. 1994, pp. 211–214.*

Yim et al., "Datapath layout optimisation using genetic algorithm and simulated annealing," IEE Proc.–Comput. Digit. Tech., vol. 145, No. 2, Mar. 1998, pp. 135–141.*

* cited by examiner

Primary Examiner—Matthew Smith
Assistant Examiner—Leigh Marie Garbowski
(74) Attorney, Agent, or Firm—Staas & Halsey LLP

(57) ABSTRACT

The present invention relates to a technique relating to a method of processing a layout optimization problem. In connection with an element layout optimization problem in which it is requested to optimally arrange a plurality of elements within a space of two or more dimension, a first algorithm executing step is carried out. In this step, when information concerning the state of initial layout of the plurality of elements is available, a genetic algorithm is executed, thereby reducing non-uniformity in density of the plurality of elements staying in the initial layout. Subsequently, a second algorithm executing step is executed. In this step, when there are input data regarding the state of layout unbalance reduction halfway stage of the plurality of elements after reduction of non-uniformity in density in the first algorithm executing step, a local layout unbalance reducing algorithm is executed, thereby further reducing non-uniformity in density of the plurality of elements staying in the layout unbalance reduction halfway stage. As a result, the layout optimization problem of optimally arranging the plurality of elements in a space is processed. In this way, an element layout optimization problem of large scale is also processed.

56 Claims, 29 Drawing Sheets

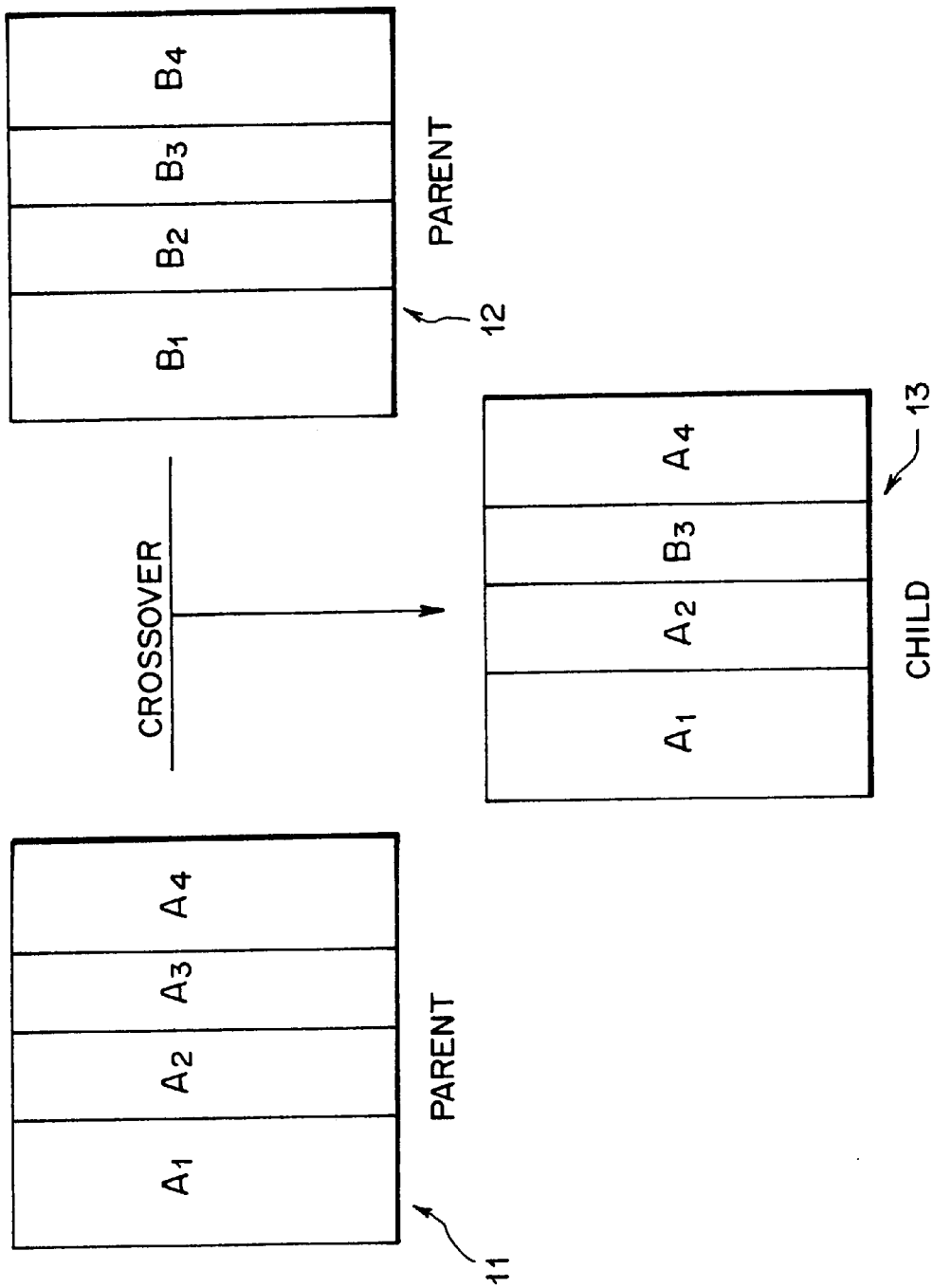

FIG. 9
REPRODUCTION
| CHROMOSOME | FITNESS |
|---|---|
| 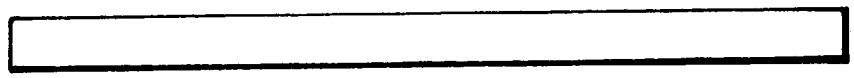 | f0 |
| 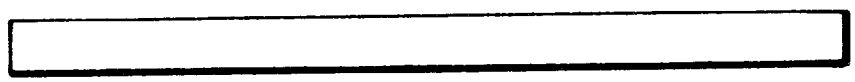 | f1 |
| ⋮ | ⋮ |
|  | fn |

FIG. 10
CROSSOVER
PARENTS
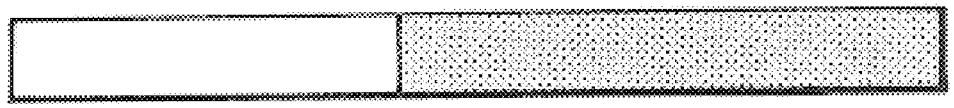
↓
CHILDREN
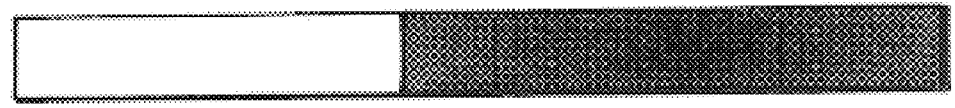
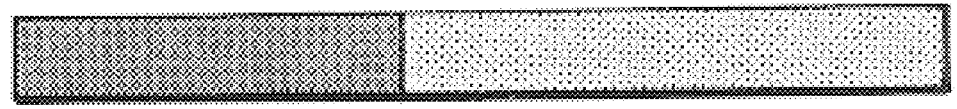

FIG. 11
MUTATION

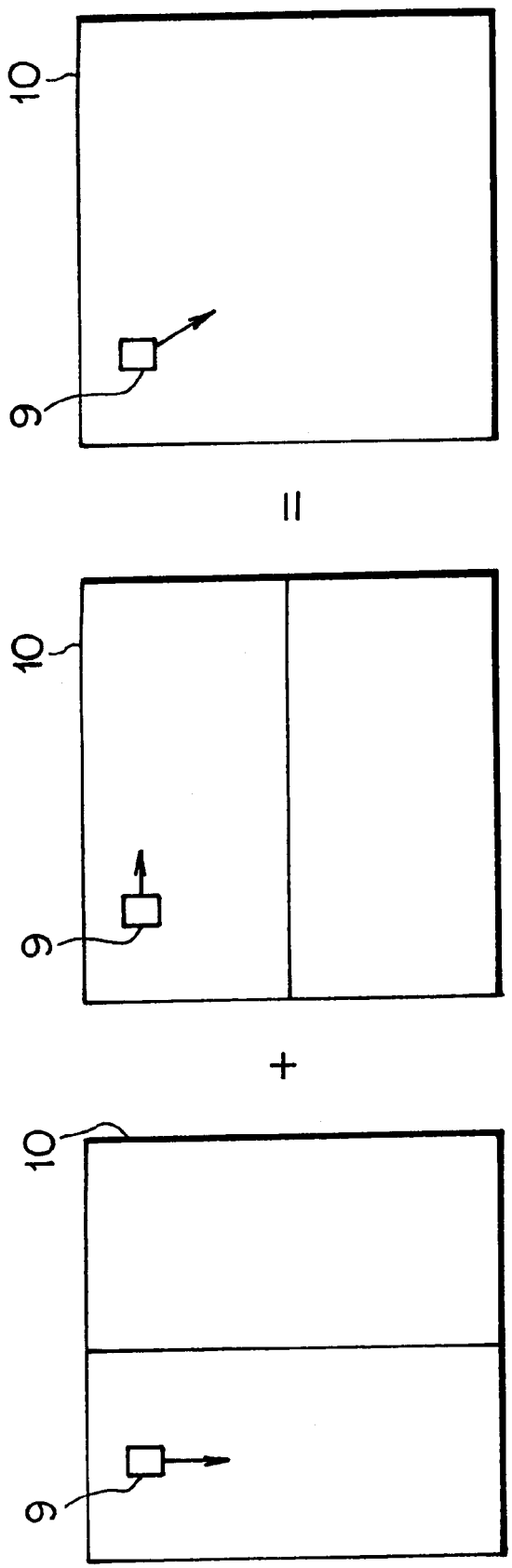

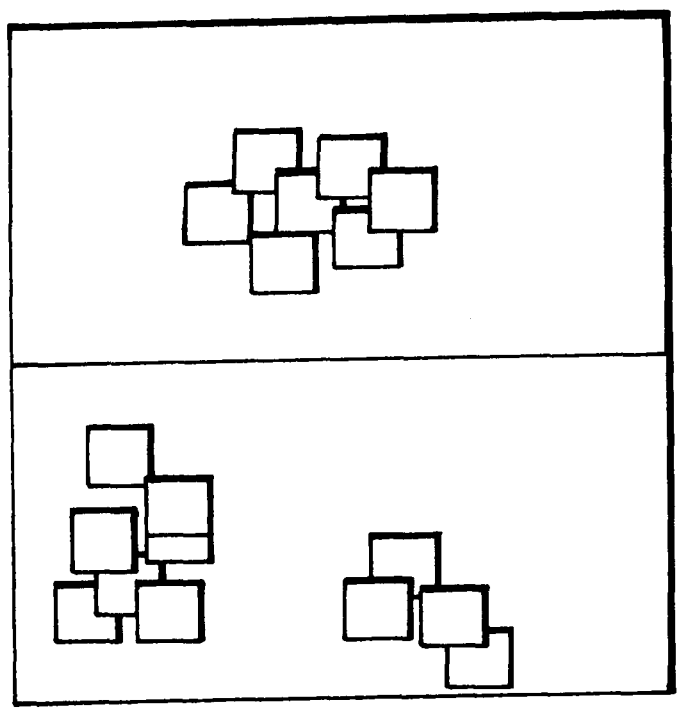
FIG. 28(a)
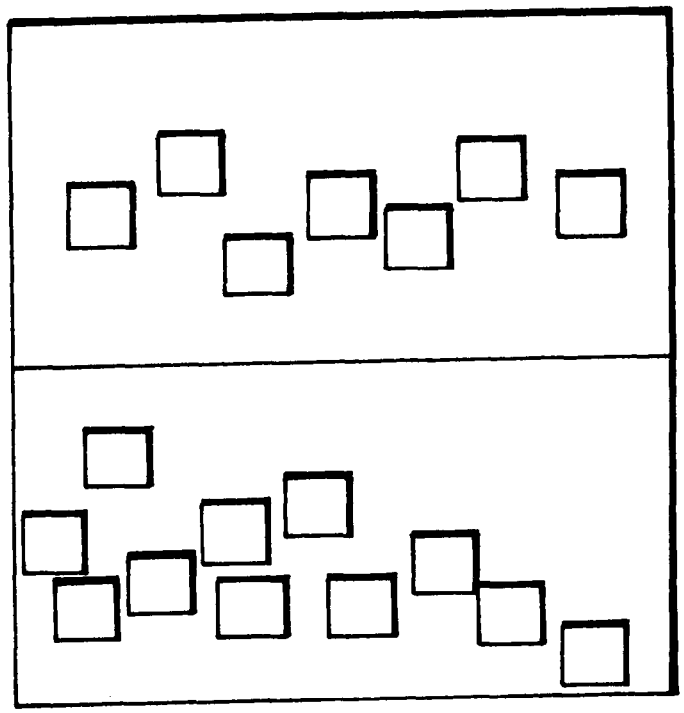
FIG. 28(b)

METHOD FOR SOLVING A LAYOUT OPTIMIZATION PROBLEM, AND COMPUTER-READABLE RECORDING MEDIUM HAVING A LAYOUT OPTIMIZATION PROBLEM PROCESSING PROGRAM RECORDED THEREON

BACKGROUND OF THE INVENTION (1) Field of the Invention

The present invention relates to a layout optimization problem solving method and program for use in solving a circuit layout optimization problem relating to optimum arrangement of circuits on, for example, a large-scale integrated (LSI) circuit; more commonly, to an element layout optimization problem relating to optimum arrangement of a plurality of elements (or elements to be arranged) in two or more dimensions, as well as to a computer-readable recording medium having the layout optimization problem solving program recorded thereon.

(2) Description of the Related Art

The element layout optimization problem is one relating to optimum arrangement, in a required space (or in a required area if the elements are two-dimensional), of a plurality of elements having a specified connection relationship. The problem is also called a graph mapping problem.

For example, if the optimum arrangement of individual circuits on the LSI circuit is determined, the LSI circuit can be made compact, and the length of wiring patterns used for interconnecting the circuits is minimized, thus enabling an improvement in wiring and the processing speed of the LSI circuit.

The element layout optimization problem can be solved by execution of an optimization problem solving algorithm (for example, a genetic algorithm, a min-cut method, an n-element exchange method, or a like method) to thereby determine the optimum layout of a plurality of elements in a required space, and by arranging the plurality of elements in the space on the basis of the determination.

If the element layout optimization is of large scale (that is, the number of elements to be optimally arranged is very large), the optimum layout of the elements is determined by taking the individual elements as points (or as the same shape) without consideration of size of the individual elements, in order to execute the optimization problem solving algorithm at high speed.

Since each of the elements has its own unique size, an overlap or clearance arises among elements even when the elements are arranged according to the thus-determined optimum layout, so that the arrangement of the elements is excessively loose or excessively dense.

In order to process the element layout optimization problem of large scale at high speed, an optimization problem solving algorithm is executed without consideration of size of the respective elements, and the resultant non-uniformity in density of the layout elements (layout unbalance) must be removed or reduced.

SUMMARY OF THE INVENTION

The present invention has been conceived to solve the foregoing problem, and the object of the present invention is to provide a layout optimization problem processing method which enables uniform arrangement of elements within space by reducing non-uniform arrangement in density of the elements, thereby processing an element layout optimization problem of large scale at high speed. Further, another object of the present invention is to provide a computer-readable recording medium on which is recorded a layout optimization problem processing program used for activating a computer to solve the element layout optimization problem.

To this end, the present invention provides a method of processing a layout optimization problem in which it is requested to find the optimal layout on a predetermined layout space for a plurality of elements that ought to be subjected to a predetermined connection relationship, comprising the steps of:

a first algorithm executing step of executing a genetic algorithm when information concerning the plurality of elements staying in an initial condition is available so that non-uniformity in density of the plurality of elements is reduced to bring the plurality of elements into a layout unbalance reduction halfway stage; and a second algorithm executing step of executing a local layout unbalance reducing algorithm when information concerning the plurality of elements staying in the layout unbalance reduction halfway stage is available, whereby the non-uniformity in density of the plurality of elements staying in the layout unbalance reduction halfway stage is further reduced.

Here, the genetic algorithm can be executed in the first algorithm executing step by expressing the states of layout of the plurality of elements as genes; and by using, as a candidate solution for a problem of arranging the plurality of elements within the space, a chromosome which comprises a sequence of the genes and is defined as the space.

At the time of execution of the genetic algorithm, crossover can be carried out as a genetic operation in the first algorithm executing step by dividing the space, within which the plurality of elements are to be arranged, into a plurality of sub-divided spaces, thereby dividing the chromosome into a plurality of regions; and by exchanging at least one region selected from the plurality of regions in the chromosome with a counterpart portion in another chromosome.

Further, at the time of execution of the genetic algorithm, crossover can be carried out as a genetic operation in the first algorithm executing step by dividing the space, within which the plurality of elements are to be arranged, into a plurality of sub-divided spaces, thereby dividing the chromosome into a plurality of regions; and by pasting a specific region of the plurality of regions within the chromosome to a counterpart portion region of another chromosome if the specific region is found to have lower non-uniformity in density than that of the counterpart region.

At the time of execution of the genetic algorithm, mutation can be carried out as a genetic operation in the first algorithm executing step by dividing the space, within which the plurality of elements are to be arranged, into a plurality of sub-divided spaces, thereby dividing the chromosome into a plurality of regions; and by moving at least one of the plurality of elements within its respective regions.

Further, at the time of execution of the genetic algorithm, selection can be carried out as a genetic operation in the first algorithm executing step by use of a fitness function which enables a chromosome having lower non-uniformity in density of the plurality of elements to assume a great fitness value.

The present invention also provides a method of processing a layout optimization problem in which it is requested to find the optimal layout on a predetermined layout space for a plurality of elements that ought to be subjected to a predetermined connection relationship, comprising the steps of:

a first algorithm executing step of executing a genetic algorithm; and a second algorithm executing step of executing a local layout unbalance reducing algorithm;

wherein the first algorithm executing step and the second algorithm executing step are combined to calculate the optimum value of a parameter utilized upon executing the local layout unbalance reducing algorithm, whereby non-uniformity in density of the plurality of elements staying in the initial layout is reduced.

In the first algorithm executing step, the parameter used for executing the local layout unbalance reducing algorithm can be expressed as a gene, and a chromosome comprising the sequence of the gene is used as a candidate solution for a problem of determining the parameter, thereby effecting the genetic algorithm.

In the second algorithm executing step, when the space within which the plurality of elements are arranged is divided into a plurality of sub-divided spaces, the parameter comprises information for specifying the sizes of the sub-divided spaces.

At this time, when the genetic algorithm is executed, a weighted average between genes of two parent chromosomes can be taken as a gene of a child chromosome in the first algorithm executing step, thereby effecting crossover as a genetic operation.

In the first algorithm executing step, when the genetic algorithm is executed, a portion of the chromosome may be pasted to a counterpart portion of another chromosome while the total sum of data for specifying the sizes of the sub-divided spaces included in the parameter is controlled so as to become unchanged, thereby executing crossover as a genetic operation.

Further, in the first algorithm executing step, when the genetic algorithm is executed, at least two genes of the chromosome are selected, and an arbitrary numerical value is added to the thus-selected genes so as not to change the total sum of data for specifying the size of the sub-divided space included in the parameter, thereby effecting mutation as a genetic operation.

In the first algorithm executing step, when the genetic algorithm is executed, selection can be effected as a genetic operation by use of a fitness function which enables a chromosome capable of reducing non-uniformity indensity of the plurality of elements to assume a high fitness value.

The layout optimization problem processing method is characterized in that, when the space within which the plurality of elements are arranged is divided into a plurality of sub-divided spaces, non-uniformity in density of the plurality of elements within each of the sub-divided spaces is reduced in the second algorithm executing step.

An algorithm to which a hydrodynamic analogy is applied can be used as the local layout unbalance reducing algorithm in the second algorithm executing step.

More specifically, the algorithm to which a hydrodynamic analogy is applied can be executed in the second algorithm executing step by moving at least one of the plurality of elements staying in the layout unbalance reduction halfway stage from a high-density location to a low-density location.

When the space within which the plurality of elements are to be arranged is divided into a plurality of sub-divided spaces, at least one of the plurality of elements included in each sub-divided space is moved from a high-density location to a low-density location within the sub-divided space in the second algorithm executing step.

Further, an algorithm to which a morphing analogy is applied can also be used as the local layout unbalance reducing algorithm in the second algorithm executing step.

More specifically, the algorithm to which a morphing analogy is applied can be executed in the second algorithm executing step by determining the center of morphing on the basis of the data regarding the plurality of elements staying in the layout unbalance reduction halfway stage, and by moving at least one of the plurality of elements to a location distant from the center of morphing.

When the space within which the plurality of elements are arranged is divided into a plurality of sub-divided spaces, determining the center of morphing for each of the sub-divided spaces and moving at least one of the plurality of elements included in each sub-divided space to a location distant from the center of morphing within the sub-divided space are carried out in the second algorithm executing step.

Further, the present invention provides a method of processing a layout optimization problem in which it is requested to find the optimal layout on a predetermined layout space for a plurality of elements that ought to be subjected to a predetermined connection relationship, comprising the steps of:

a first algorithm executing step of executing a genetic algorithm; and a second algorithm executing step of executing a local layout unbalance reducing algorithm;

wherein the layout optimization problem is processed by reduction of non-uniformity in density of the plurality of elements staying in the initial layout.

More specifically, in the first algorithm executing step, the layout states of the plurality of elements are expressed as genes, and a chromosome which comprises a sequence of the genes and is defined as the space is used as a candidate solution for the problem of arranging the plurality of elements in the space, whereby the local layout unbalance reducing algorithm is executed in the second algorithm executing step during execution of the genetic algorithm.

Further, in the first algorithm executing step, the parameter used for executing the local layout unbalance reducing algorithm is expressed as a gene, and a chromosome comprising a sequence of the gene is used as a candidate solution for a problem of determining the parameter, whereby the local layout unbalance reducing algorithm is executed in the second algorithm executing step during execution of the genetic algorithm.

Further, in the first algorithm executing step, the parameter used for executing the local layout unbalance reducing algorithm is expressed as a gene; a chromosome comprising a sequence of the gene is used as a candidate solution for a problem of determining the parameter; the layout states of the plurality of elements are expressed as genes; and a chromosome which comprises a sequence of the genes and is defined as the space is used as a candidate solution for the problem of arranging the plurality of elements in the space, whereby the local layout unbalance reducing algorithm may be executed in the second algorithm executing step during execution of the genetic algorithm.

In the first algorithm executing step, the layout states of the plurality of elements are expressed as genes; a chromosome which comprises a sequence of the genes and is defined as the space is used as a candidate solution for the problem of arranging the plurality of elements within the space; the parameter used for executing the local layout unbalance reducing algorithm is expressed as a gene; and a chromosome comprising a sequence of the gene is used as a candidate solution for a problem of determining the parameter, whereby the local layout unbalance reducing algorithm may be executed in the second algorithm executing step during execution of the genetic algorithm.

The present invention also provides a computer-readable recording medium on which is recorded a layout optimization problem processing program for causing a computer to process a layout optimization problem in which it is requested to find the optimal layout on a predetermined layout space for a plurality of elements that ought to be subjected to a predetermined connection relationship, wherein the program causes the computer to act as:

first algorithm execution means for executing a genetic algorithm when information concerning the plurality of elements staying in an initial condition is available so that non-uniformity in density of the plurality of elements is reduced to bring the plurality of elements into a layout unbalance reduction halfway stage; and second algorithm execution means for executing a local layout unbalance reducing algorithm when information concerning the plurality of elements staying in the layout unbalance reduction halfway stage is available, whereby the non-uniformity in density of the plurality of elements staying in the layout unbalance reduction halfway stage is further reduced.

Further, the present invention provides a computer-readable recording medium on which is recorded a layout optimization problem processing program for causing a computer to process a layout optimization problem in which it is requested to find the optimal layout on a predetermined layout space for a plurality of elements that ought to be subjected to a predetermined connection relationship, wherein the program causes the computer to act as:

first algorithm execution means for executing a genetic algorithm; and second algorithm execution means for executing a local layout unbalance reducing algorithm;

wherein the first algorithm execution means and the second algorithm execution means are combined to calculate the optimum value of a parameter utilized upon executing the local layout unbalance reducing algorithm, whereby non-uniformity in density of the plurality of elements staying in the initial layout is reduced.

The present invention also provides a computer-readable recording medium on which is recorded a layout optimization problem processing program for causing a computer to process a layout optimization problem in which it is requested to find the optimal layout on a predetermined layout space for a plurality of elements that ought to be subjected to a predetermined connection relationship, wherein the program causes the computer to act as:

first algorithm execution means for executing a genetic algorithm; and second algorithm execution means for executing a local layout unbalance reducing algorithm.

Accordingly, by means of the foregoing configuration, at the time of arrangement of a plurality of elements having a specified connection relationship within a required space, the layout optimization problem processing method comprises a first algorithm executing step for executing a genetic algorithm, and a second algorithm executing step for executing a local layout unbalance reducing algorithm. Therefore, there is yielded an advantage to an ability to quickly reduce non-uniformity in density of elements even at the time of processing of a layout optimization problem of large scale.

In the second algorithm executing step, at least one of the plurality of elements can be moved while the proximal relationship among the plurality of elements is conserved.

Further, in the second algorithm executing step, at least one of the plurality of elements can also be moved while the relative positional relationship among the plurality of elements is conserved.

Thus, in the second algorithm executing step, at least one of the plurality of elements can be moved while the proximal relationship among the plurality of elements or the relative positional relationship among the plurality of elements is conserved. Therefore, the range of layout optimization problems capable of being solved can be enlarged.

In the second algorithm executing step, when at least one of the plurality of elements is moved from the center of morphing to a distant location, the distance between the center of morphing and the element to be moved can be linearly enlarged.

Further, in the second algorithm executing step, when at least one of the plurality of elements is moved from the center of morphing to a distant location, the distance between the center of morphing and the element to be moved can also be non-linearly enlarged.

Thus, in the second algorithm executing step, the distance between the center of morphing and the element to be moved can be linearly or non-linearly enlarged, thereby enabling an enlargement of the range of layout optimization problems capable of being solved.

In the second algorithm executing step, elements to be subjected to reduction of non-uniformity in density can also be sequentially added when non-uniformity in density of the plurality of elements staying in the layout unbalance reduction halfway stage is reduced.

If a stationary element which cannot be moved exists among the plurality of elements, the stationary element is read as an element capable of undergoing reduction of non-uniformity in density in the second algorithm executing step, and non-uniformity in density of the plurality of elements staying in the layout unbalance reduction halfway stage can be reduced.

If a large element accounting for a larger proportion of the space than any of the other elements exists among the plurality of elements, the distance over which the large element is moved is reduced in the second algorithm executing step, and non-uniformity in density of the plurality of elements staying in the layout unbalance reduction halfway stage is reduced.

In the second algorithm executing step, the elements to be moved can be simultaneously moved at the time of reduction of non-uniformity in density of the plurality of elements staying in the layout unbalance reduction halfway stage.

In the second algorithm executing step, the elements to be moved can be moved gradually at the time of reduction of non-uniformity in density of the plurality of elements staying in the layout unbalance reduction halfway stage.

Therefore, by means of the foregoing configuration, in the second algorithm executing step, elements to be subjected to reduction of non-uniformity in density can be sequentially added; the stationary element can be read as an element to undergo reduction of non-uniformity in density; the distance over which the large element is moved can be reduced; the elements to be moved can be moved simultaneously; and the elements to be moved can be moved gradually. Therefore, the range of layout optimization problems capable of being solved can be further enlarged.

Further, a first island and a second island may be used in the first algorithm executing step; the first island comprising at least one chromosome group (population); the chromosome group including a plurality of sub-divided regions formed by vertically dividing the space within which the plurality of elements are arranged; the second island comprising at least one chromosome group (population); and the chromosome group including a plurality of sub-divided regions formed by horizontally dividing the space within which the plurality of elements are arranged.

At this time, the chromosome pertaining to the first island and the chromosome pertaining to the second island may be subjected to a genetic operation, i.e., crossover, in the first algorithm executing step, at the time of execution of the genetic algorithm; by application of the local layout unbalance reducing algorithm to the chromosome pertaining to the first island and to the chromosome pertaining to the second island to thereby move specific elements within the respective regions of the chromosomes; and by moving the specific elements within the respective chromosomes according to the sum of vectors relating to the distances over which the specific element pertaining to the first island and the specific element pertaining to the second island are moved.

The chromosome pertaining to the first island and the chromosome pertaining to the second island may be subjected to a genetic operation, i.e., crossover, in the first algorithm executing step, at the time of execution of the genetic algorithm; by extraction of a region including a specific element from the chromosome pertaining to either the first or second island; by reading the thus-extracted region a counterpart region of the chromosome pertaining to the other island; and by inserting the region into the other island.

Therefore, by means of the foregoing configuration, in the first algorithm executing step, a first island and a second island can also be used at the time of execution of the genetic algorithm; the first island comprising a chromosome group (population) including a plurality of vertically-split sub-divided regions; and the second island comprising a chromosome group including a plurality of horizontally-split sub-divided regions. Therefore, the diversity of the chromosomes which are included in the chromosome group and act as candidate solutions for solution can be maintained, and efficient retrieval of an optimum solution and efficient reduction of non-uniformity in density of elements can be effected.

BRIEF DESCRIPTION OF THE DRAWINGS

FIG. 6 shows one example of crossover carried out by a genetic algorithm (GAc) employed in the layout optimization problem processing method according to the first embodiment;

FIG. 9 is a diagram for describing the common genetic algorithm;

FIG. 10 is a diagram for describing the common genetic algorithm;

FIG. 11 is a diagram for describing the common genetic algorithm;

FIGS. 13(a) to 13(c) show one example of a method of moving layout elements which is used for the layout optimization problem processing method according to the first embodiment and employs an algorithm to which a hydrodynamic analogy is applied;

FIGS. 28(a) and 28(b) show an example of application of the present invention to a cell layout problem.

DESCRIPTION OF THE PREFERRED EMBODIMENTS

Preferred embodiments of the present invention will be described hereinbelow by reference to the drawings.

Figure 1:
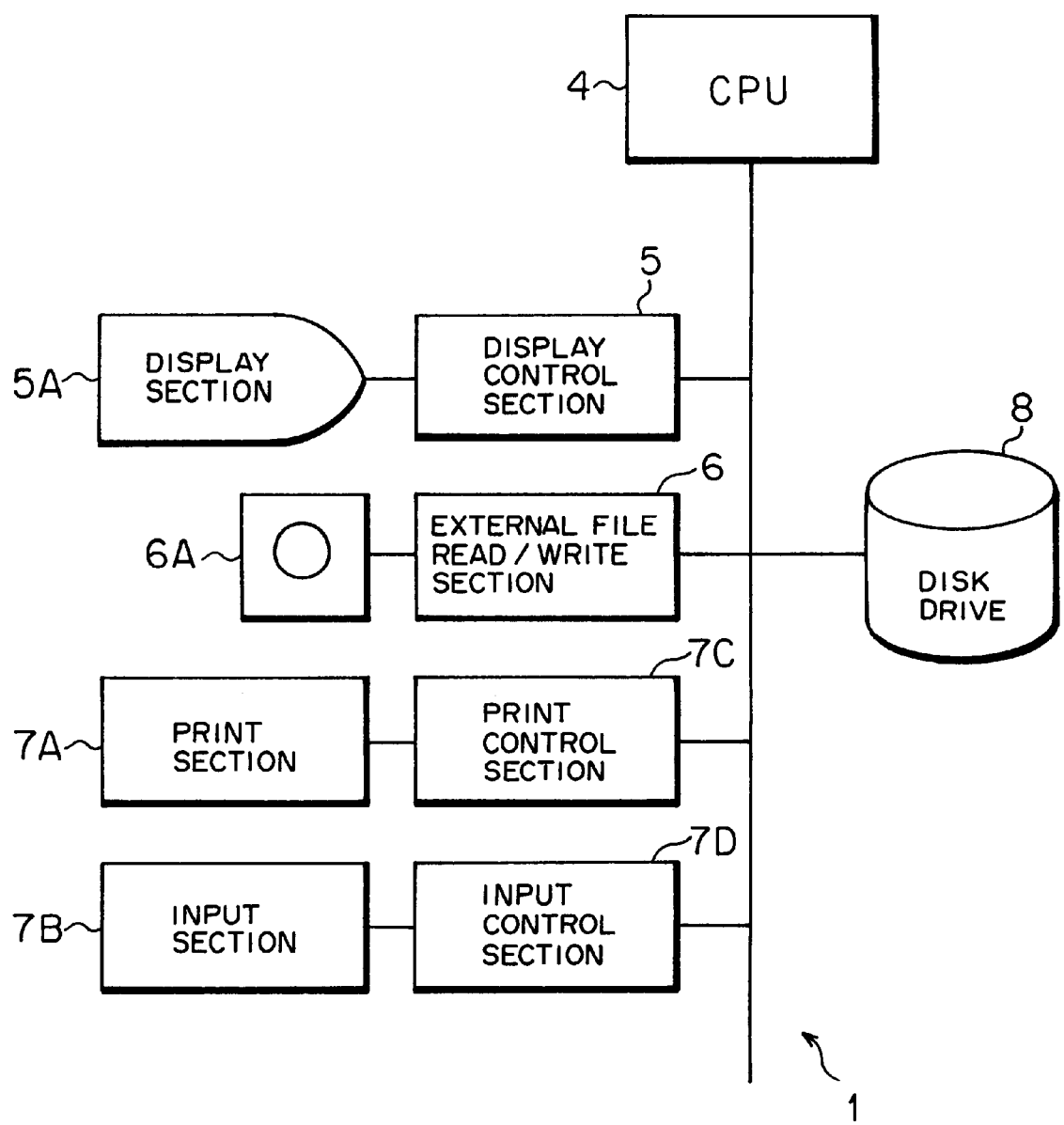
FIG. 1 is a block diagram showing a configuration of a layout optimization processing system which performs a layout optimization problem processing method according to the present invention.

(a) Description of Configuration of Layout Optimization Problem Processing System FIG. 1 is a block diagram showing the configuration of a layout optimum optimization processing system. A layout optimization problem processing system 1 shown in FIG. 1 is intended to carry out a layout optimization problem processing method according to the present invention.

In FIG. 1, reference numeral 5A designates a display section for displaying the result of optimum layout of elements determined by way of various setting screens or processing; 5 designates a display control section for controlling the state of a display indicated on the display section 5A; 7B designates an input section such as a keyboard or a mouse by way of which an operator enters response data by reference to the data indicated on the display section 5A; and 7D designates an input control section for controlling the input section 7B.

Reference numeral 8 designates a disk drive for storing all the data (such as an operating system) required for activating the layout optimization problem processing system 1 and a layout optimization problem processing program, as will be described later.

Reference numeral 6 designates an external file read/write section; 6A designates an external file; 7A designates a print section; and 7C designates a print control section. According to an instruction entered by way of the input section 7B, the external file read/write section 6 records the optimum layout of the plurality of nodes indicated on the display section 5A onto the external file 6A, or the print section 7A records the same layout onto a predetermined sheet.

Reference numeral 4 designates a CPU for managing individual sections of the layout optimization problem processing system 1 in a centralized manner.

When a plurality of elements having a specified connection relationship are arranged in required space, the CPU 4 acts as first and second algorithm execution means.

Here, the first algorithm execution means executes a genetic algorithm, as will be described later; and the second algorithm execution means executes a local layout unbalance reducing algorithm, as will be described later.

More specifically, upon entry of data on the initial layout of the plurality of elements, the first algorithm execution means executes a genetic algorithm, thereby reducing non-uniformity in density of the elements staying in an initial layout and bring the elements into a layout unbalance reduction halfway stage (intermediate layout).

Upon entry of data on the layout unbalance reduction halfway stage of the plurality of elements after the first algorithm execution means has reduced the non-uniformity in density, the second algorithm execution means executes a local layout unbalance reducing algorithm, thereby further reducing the non-uniformity in density of the plurality of elements staying in the layout unbalance reduction halfway stage.

Alternatively, the first and second algorithm execution means may be utilized in combination to thereby determine an optimum parameter to be used for executing the local layout unbalance reducing algorithm. The second algorithm execution means may be executed through use of the thus-obtained optimum parameter, thereby reducing non-uniformity in density of the plurality of elements staying in the initial layout.

In effect, the functions corresponding to the first and second algorithm execution means are embodied by loading a program (hereinafter referred to as a "layout optimization problem processing program") recorded on a recording medium, such as the previously-described disk drive 8 or CD-ROM (not shown), into unillustrated memory (e.g., RAM), and by causing the CPU 4 to execute the program.

The layout optimization problem processing program is intended to solve the layout optimization problem; i.e., the optimum arrangement of the plurality of elements having a specified connection relationship in a required space, through use of a computer and is intended to cause the computer to act as the first and second algorithm execution means.

The layout optimization problem processing program is recorded on, e.g., CD-ROM, and is used after having been installed into the disk drive 8 of the computer from CD-ROM.

The disk drive 8 or CD-ROM corresponds to a computer-readable recording medium having a layout optimization problem processing program recorded thereon.

As mentioned above, the layout optimization problem processing system 1 according to the present embodiment can be embodied by use of an ordinary computing system (or computer) comprising the CPU 4, the display section 5A, the display control section 5, the external file read/write section 6, the print section 7A, the print control section 7C, the input section 7B, the input control section 7D, the disk drive 8, and so on.

As will be described later, the layout optimization problem processing system 1 solves the layout optimization problem regarding the optimum arrangement of the plurality of layout elements 9 in a layout region 10.

(b) Description of the Layout Optimization Problem Processing Method According to the Present (b1) Basic Concept The basic concept on the layout optimization problem processing method according to the present invention will now be described by reference to FIGS. 2 through 5(b). In FIGS. 4(a) to 5(b), reference numeral 9 designates elements (hereinafter referred to as "layout elements"). In FIG. 3(a) to FIG. 5(b), reference numeral 10 designates space in which the layout elements 9 are to be arranged (hereinafter referred to as a "layout region").

Figure 2:
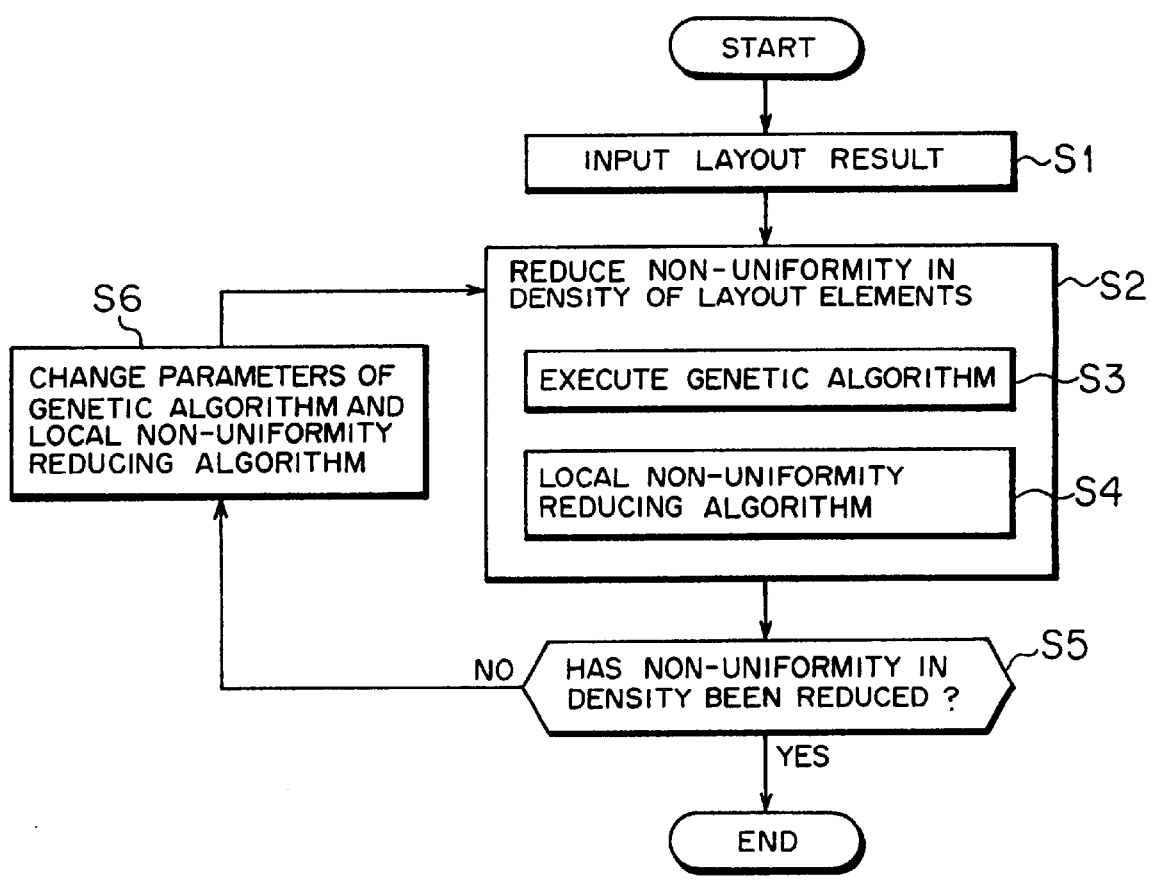
FIG. 2 is a flowchart for describing the layout optimization problem processing method according to the present invention.

Under the layout optimization problem processing method according to the present invention, when the plurality of layout elements 9 having a specified connection relationship are arranged in the required layout region 10, the result of initial arrangement of the plurality of layout elements 9 (i.e., data regarding the initial arrangement of the layout elements 9) is input to the layout optimization problem processing system 1 (step S1 shown in FIG. 2). The layout elements 9 are of different sizes. Hence, an initial layout result input to the layout optimization problem processing system 1 is usually characterized in that the layout elements 9 are unevenly arranged in the layout region 10 to thereby cause non-uniformity in density.

Upon entry of the initial layout result of the layout elements 9, the layout optimization problem processing system 1 reduces the non-uniformity in density of the layout elements 9 (step S2 shown in FIG. 2).

In step S2, both a genetic algorithm (in step S3 which is shown in FIG. 2 and corresponds to a first algorithm executing step) and a local layout unbalance reducing algorithm (in step S4 which is shown in FIG. 2 and corresponds to a second algorithm executing step) are carried out.

More specifically, in step S3 a genetic algorithm (GAc) or a genetic algorithm (GAp) is executed as a genetic algorithm. Further, in step S4 an algorithm to which a hydrodynamic analogy is applied or an algorithm to which a morphing analogy is applied is executed as the local layout unbalance reducing algorithm. Here, GA stands for a genetic algorithm.

Details of these algorithms will be described later.

Further, execution of the genetic algorithm (GAp) in step S3 will be described in the section "(b4) Description of the Second Embodiment."

Figure 3A:
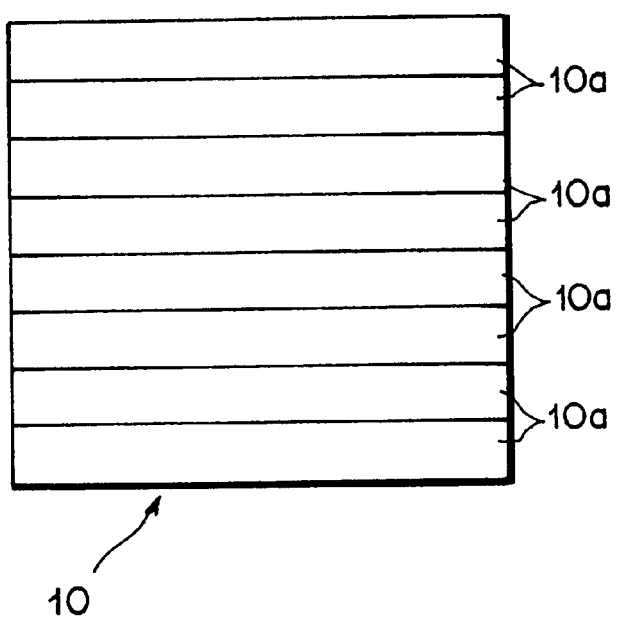
FIGS. 3(a) and 3(b) show creation of sub-divided regions by division of a layout region.
Figure 3B:
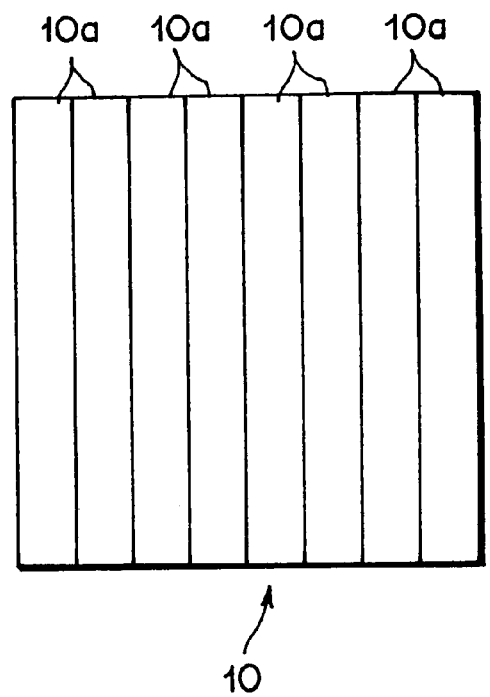

At the time of execution of the genetic algorithm (GAc) in step S3, the initial layout result of the layout elements 9 entered in step S1 is reproduced, whereby a plurality of initial layout results to be taken as parent chromosomes are prepared. Subsequently, as shown in FIG. 3(a), the layout region 10 is horizontally split into sub-divided regions 10a at appropriate pitches. Alternatively, as shown in FIG. 3(b), the layout region 10 is vertically split into sub-divided regions 10a at appropriate pitches. The genetic algorithm (GAc) is defined and executed so as to cause crossover between genetic algorithms (GAc) for each sub-divided layout region 10a, thereby reducing non-uniformity in density of the layout elements 9 staying in the initial layout state.

Figure 4A:
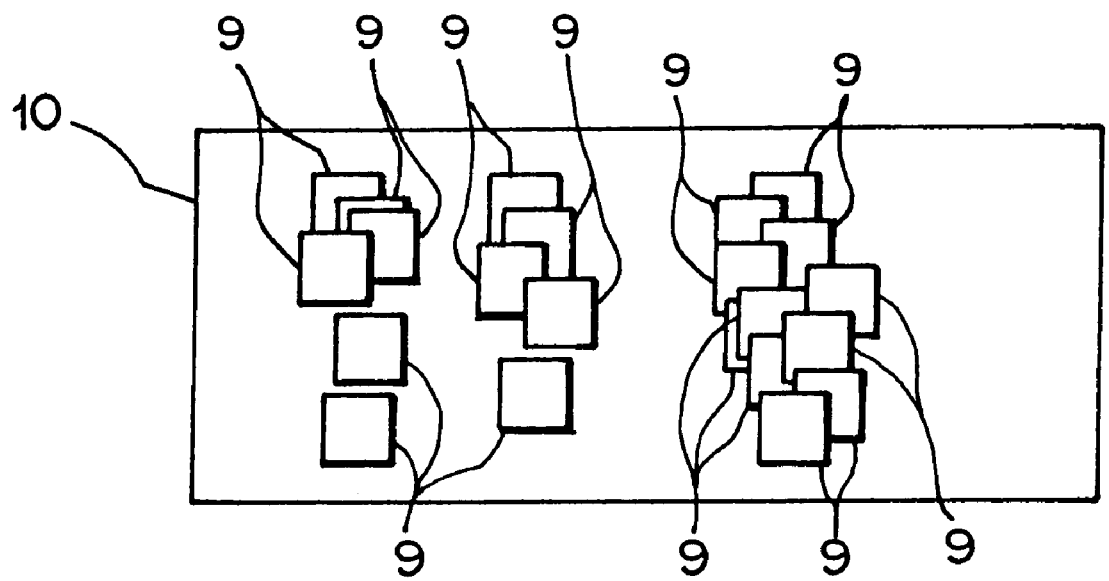
FIGS. 4(a) and 4(b) show one example of layout elements arranged in an layout unbalance reduction halfway stage.
Figure 4B:
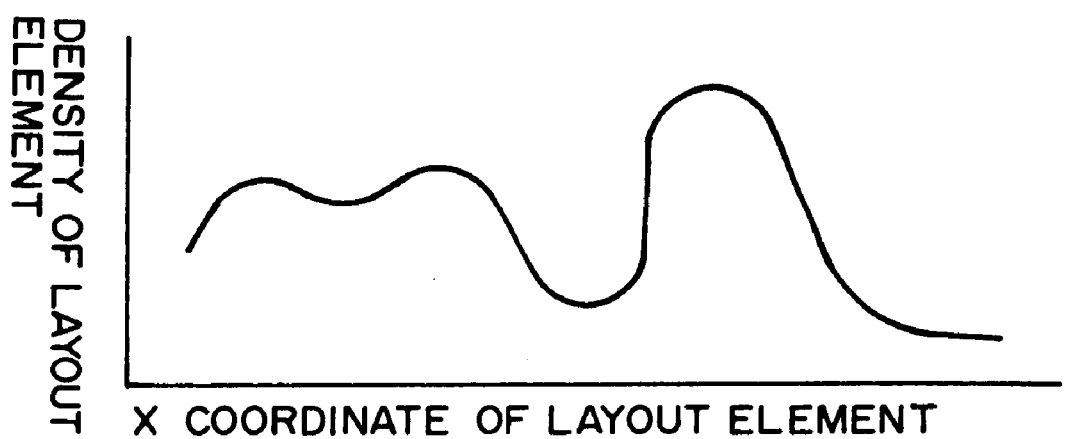

FIG. 4(a) shows one example of the layout elements 9 staying in the layout unbalance reduction halfway stage, wherein, for example, the layout region 10 is vertically split into sub-divided regions 10a and non-uniformity in density of the layout elements 9 is reduced in step S3. In the example shown in FIG. 4(a), the non-uniformity in density of the layout elements 9 is not completely reduced by execution of a mere genetic algorithm (GAc). FIG. 4(b) shows the density of the layout elements 9 staying in the layout unbalance reduction halfway stage shown in FIG. 4(a).

Upon receipt of the result of the layout elements 9 staying in the layout unbalance reduction halfway stage after reduction of non-uniformity in density of the layout elements 9 in step S3 (i.e., the data regarding the state of the layout elements 9 staying in the layout unbalance reduction halfway stage), the layout optimization problem processing system 1 executes a local layout unbalance reducing algorithm to thereby further reduce the non-uniformity in density of the layout elements 9 staying in the layout unbalance reduction halfway stage (step S4).

The local layout unbalance reducing algorithm is executed in step S4, thereby moving the layout elements 9 from a high-density location to a low-density location within the sub-divided region 10a split from the layout region 10 in step S3. As a result, the non-uniformity in density of the layout elements 9 staying in the layout unbalance reduction halfway stage is reduced. The method of reducing non-uniformity in density of the layout elements 9 through execution of the local layout unbalance reducing algorithm will be referred to as a local layout unbalance reducing method (local non-uniformity reducing method, LO).

Figure 5A:
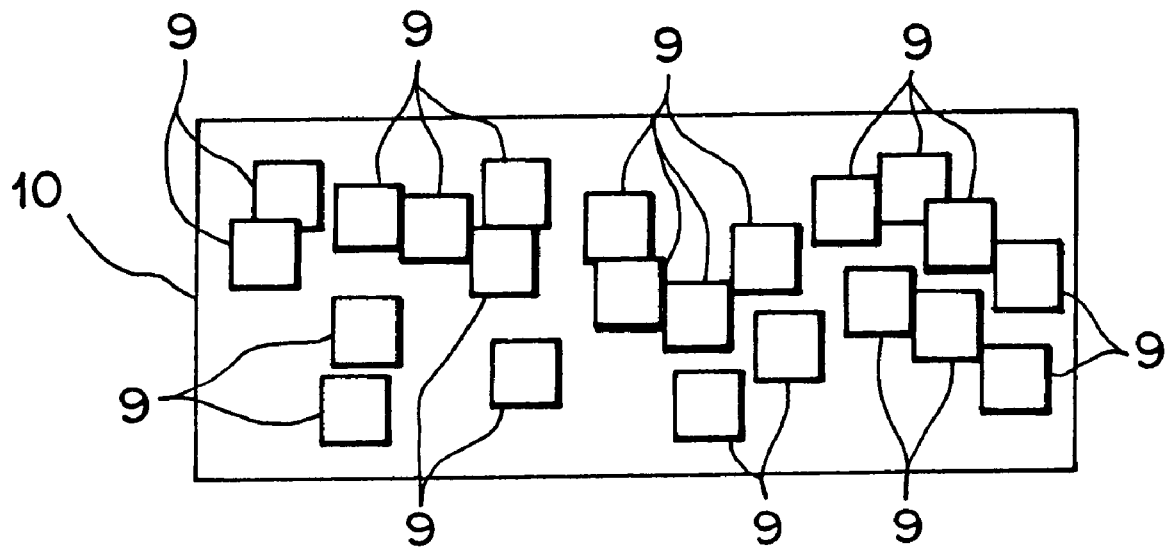
FIGS. 5(a) and 5(b) show result of reduction of non-uniformity in density of the layout elements staying in the layout unbalance reduction halfway stage.
Figure 5B:
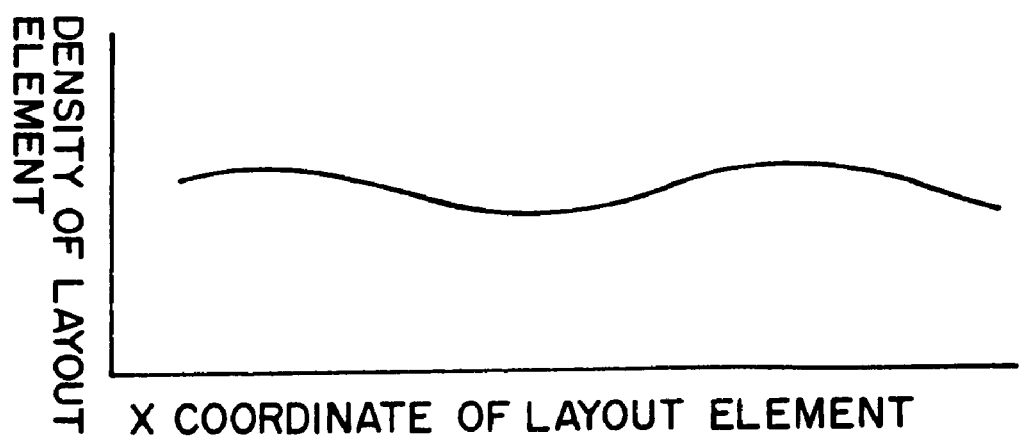

FIG. 5(a) shows the layout result in which the non-uniformity in density of the layout elements 9 has been reduced than that of the layout elements staying in the layout unbalance reduction halfway stage shown in FIG. 4(a). FIG. 5(b) shows the density of the layout elements 9 staying in the layout shown in FIG. 5(a).

The layout optimization problem processing system 1 determines whether or not the non-uniformity in density of the layout elements 9 has been reduced in step S2 (i.e., whether or not the resultant layout obtained in step S4 satisfies predetermined layout unbalance reducing criteria) (step S5). If it is determined that the non-uniformity in density of the layout elements 9 is reduced, the processing is terminated (YES is selected in step S5).

In contrast, if it is determined that the non-uniformity in density still remains (NO is selected in step S5), the parameters are changed (step S6) and the layout elements 9 are again subjected to the previously-described processing relating to step S2.

As mentioned above, under the layout optimization problem solving method according to the present invention, at the time of arrangement of the plurality of layout elements 9 having a specified connection relationship within the required layout region 10, the non-uniformity in density of the layout elements 9 staying in the initial layout is reduced by execution of the genetic algorithm (GAc), and the non-uniformity in density of the layout elements 9 staying in the layout unbalance reduction halfway stage is further reduced by execution of the local layout unbalance reducing algorithm. Consequently, even when an element layout optimization problem of large scale is processed, the non-uniformity in density of the layout elements 9 can be reduced quickly.

Specifically, since the layout optimization problem solving method according to the present invention adopts a genetic-algorithm (GAc)-based layout unbalance reducing method, global search of the genetic algorithms (GAc) enables more efficient reduction of non-uniformity in density of the layout elements 9 and contributes to an increase in the degree of fitness. Consequently, the processing speed of the layout optimization problem processing system 1 can be increased, thereby enabling quick processing of a layout optimization problem.

At this time, the local layout unbalance reducing method (LO) is executed through execution of the local layout unbalance reducing algorithm, and hence non-uniformity in density can be effectively reduced with a good prospect of reaching a solution.

As mentioned above, the layout optimization problem solving method according to the present invention comprises a first algorithm executing step for executing an genetic algorithm and a second algorithm executing step for executing a local layout unbalance reducing algorithm, both algorithms being executed at the time of arrangement of the plurality of layout elements 9 having a specified connection relationship in a required space. Under this method, non-uniformity in density of the plurality of layout elements 9 arranged in the initial layout is reduced, and the plurality of layout elements 9 are optimally staying in the layout region 10, thereby solving the layout optimization problem. Individual embodiments, each of which comprises a combination of the first and second algorithm executing steps, will be described in detail hereinbelow.

(b2) Description of the First Embodiment

A layout optimization problem processing method according to a first embodiment will now be described.

Under the layout optimization problem processing method according to the first embodiment, a genetic algorithm (GAc) is executed in the first algorithm executing step (step S3 shown in FIG. 2), and an algorithm to which the hydrodynamic analogy is applied is executed as a local layout unbalance reducing algorithm in the second algorithm executing step (step S4 shown in FIG. 2).

The genetic algorithm (GAc) executed in the first embodiment is intended to directly reduce non-uniformity in density of the layout elements 9 while the result of arrangement of the layout elements 9 is read a chromosome.

More specifically, the layout optimization problem processing method according to the first embodiment is intended to effectively reduce non-uniformity in density of the layout elements 9 by application of the genetic algorithm (GAc) to each of the chromosomes (i.e., the respective results of arrangement of the layout elements 9), and by application, to each of the chromosomes, of a local layout unbalance reducing method (LO) which employs a control parameter differing from the genetic algorithm (GAc) (i.e., a different method of moving the layout elements 9). This layout optimization problem processing method may be labeled GAc+LO.

The method of reducing non-uniformity in density of the layout elements 9 through use of the genetic algorithm (GAc) will now be described by reference to FIGS. 6 through 11.

First, the genetic algorithm is described. The genetic algorithm is a technique which imitates the genetic mechanism of a species and applies the same to an engineering problem. In short, the genetic algorithm may be considered as one technique relating to stochastic search, learning, and optimization.

During the course of evolution of a species, when an existing individual (parent) bears new individuals (children), crossover arises between chromosomes of the individual or mutations arise in genes of chromosomes. Individuals which cannot adapt to their environment die out, and individuals which adapt better to the environment survive and grow to become parents. The parents bear new individuals, so that a group of individuals adapted to the environment survive.

The degree to which each individual adapts to its environment is determined by chromosomes (the primary string of gene). In the genetic algorithm, a candidate for the solution of the layout optimization problem is expressed as a chromosome which corresponds to the primary string of gene. An objective function of the layout optimization problem corresponds to the so-called environment. A fitness function which assumes a greater value as the objective function is more optimized is defined for the chromosome.

Figure 8:
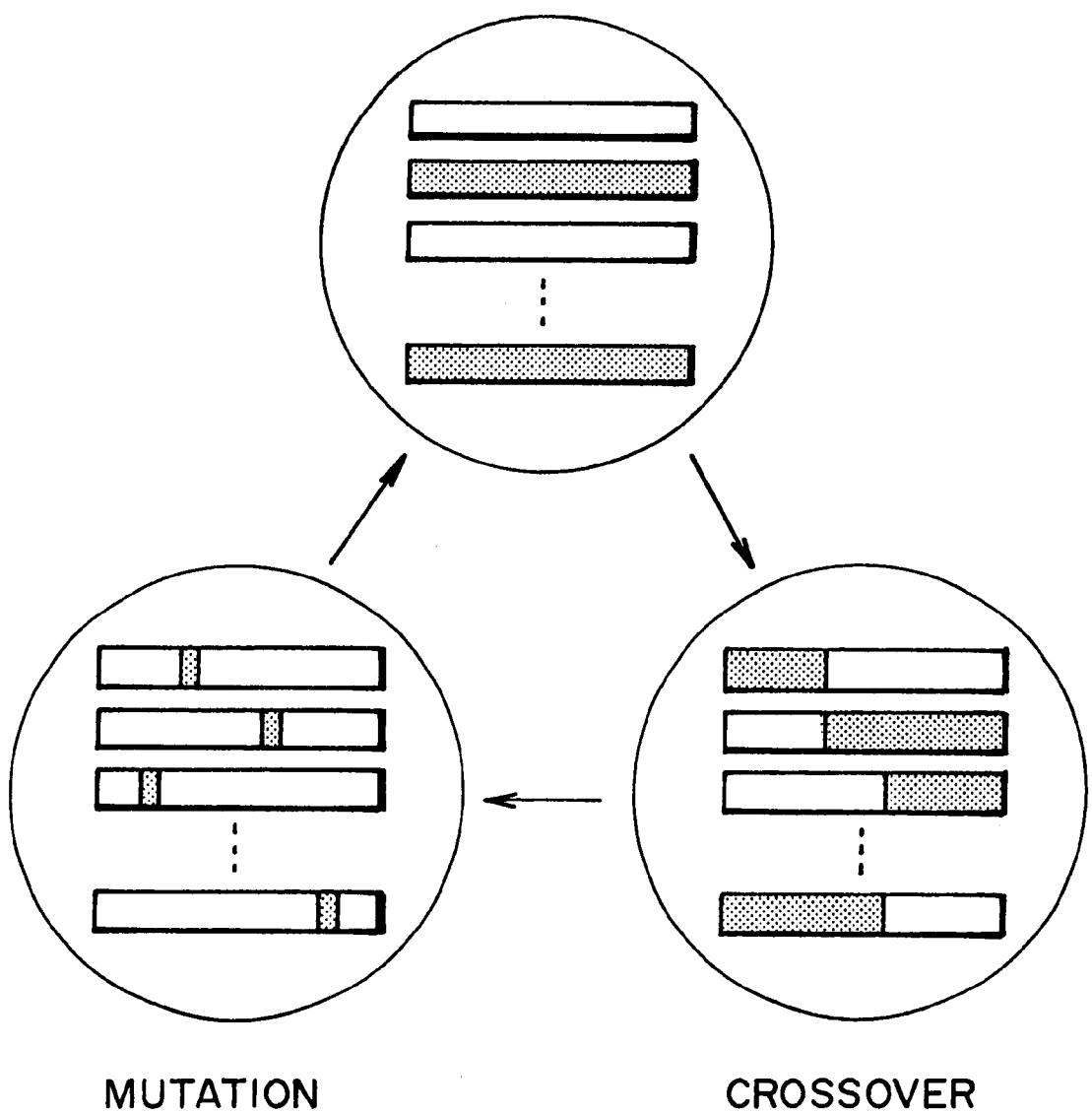
FIG. 8 is a diagram for describing a common genetic algorithm.
Figure 12B:
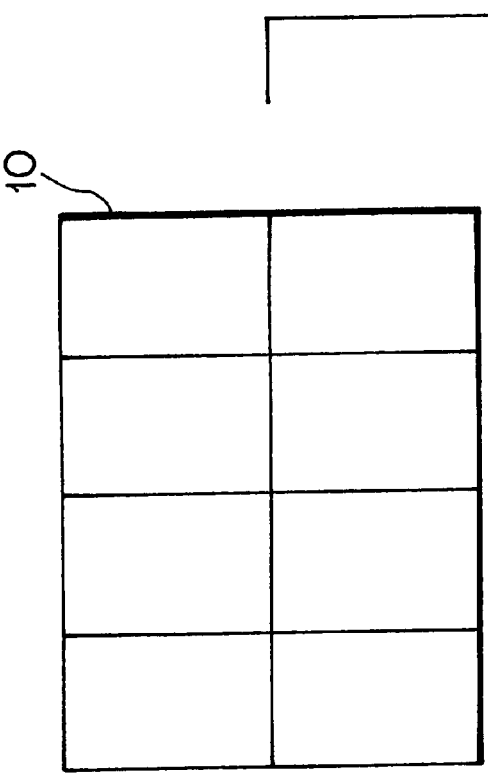
FIGS. 12(a) to 12(d) show a layout region division method which is employed in the layout optimization processing method according to the first embodiment and is used for executing a local layout unbalance reducing method (LO)
Figure 12C:
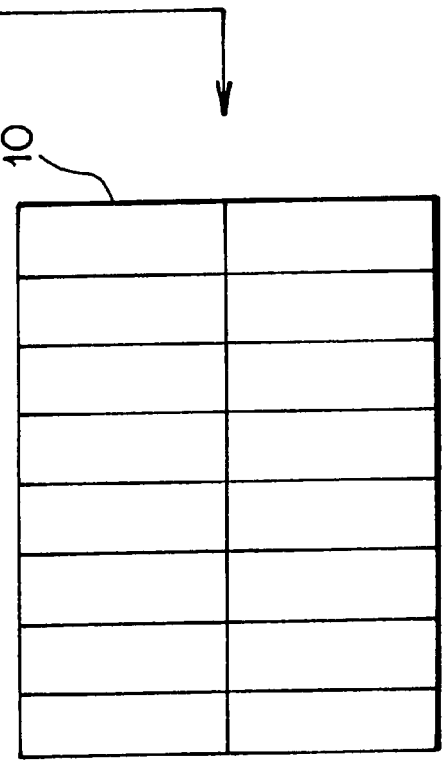
Figure 12A:
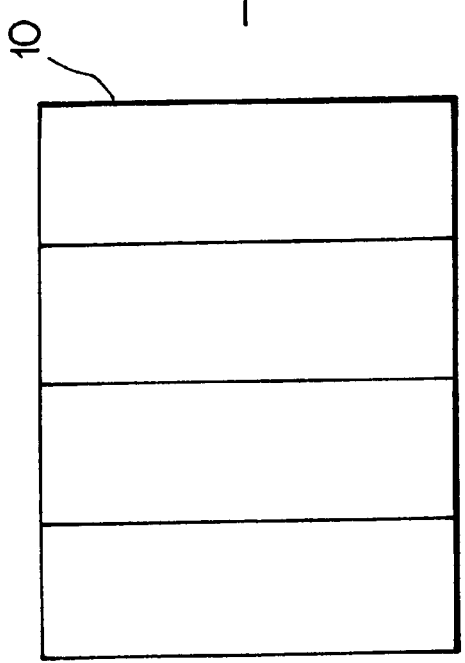
Figure 12D:
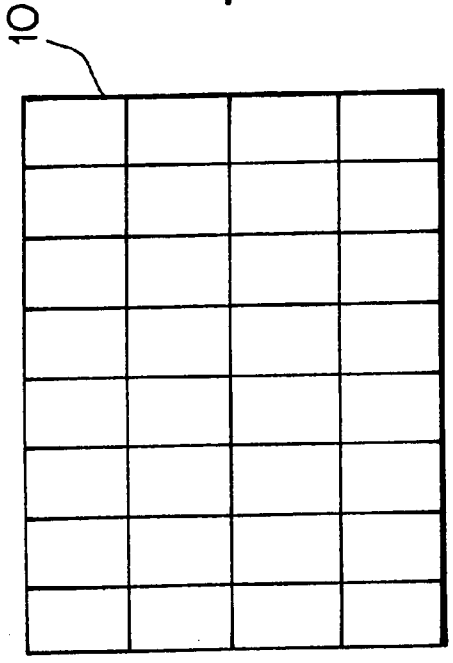

In the genetic algorithm, each chromosome is subjected to various genetic operations (selection/reproduction, crossover, and mutation) such as those shown in FIG. 8, in order to generate a chromosome capable of serving as the optimum solution of a problem (i.e., a solution for optimizing the objective function) through changing the gene arrangement of the chromosome.

Selection/reproduction is an operation for selecting with a high probability, from a group of individuals, an individual having a higher degree of fitness, as well as for allowing the thus-selected individual to grow and become a parent for the next generation (see FIG. 9). Crossover is an operation for generating a new individual (child) by interchanging portions of chromosomes of two parents (see FIG. 10). Mutation is an operation for exchanging a portion of gene of one chromosome of an individual with a portion of gene of another chromosome (see FIG. 11).

A chromosome having a higher fitness value (i.e., a solution further optimizing the objective function) can be obtained through the foregoing genetic operations.

In the first embodiment, during the first algorithm executing step, arrangements of the plurality of layout elements 9 are expressed as genes, and the genetic algorithm (GAc) is executed by using chromosome—which comprises a sequence of the genes and is defined as the layout region 10—serving as a candidate solution for solving the problem of arranging the plurality of layout elements 9 within the layout region 10.

In the first algorithm executing step, at the time of execution of the genetic algorithm (GAc), the chromosome is divided into a plurality of strip regions by dividing the layout region 10 into a plurality of sub-divided regions 10a.

More specifically, in the first algorithm executing step, a required number of reproductions of the arrangement result of the layout elements 9 are produced, and the resultant reproductions are taken as parent chromosomes. As mentioned previously, the layout region 10 is vertically or horizontally divided into sub-divided strip regions 10a [see FIGS. 3(a) and 3(b)], thereby dividing each of the chromosomes into a plurality of strip regions. Here, at the time of execution of genetic algorithm (GAc), all chromosomes are divided in the same direction.

Subsequently, in the first algorithm executing step, the genetic operation; i.e., the crossover, is carried out by replacing at least one strip region selected from the plurality of strip regions in the chromosome with a counterpart strip region in another chromosome corresponding to the thus-selected strip region (the counterpart strip region contains elements which correspond to those included in the selected strip region).

FIG. 6 shows one example of crossover. As show in FIG. 6, chromosomes 11 and 12 are stochastically selected as parent chromosomes, and replications of these chromosomes are generated. Strip regions selected from strip regions $A_1$ to $A_4$ of the chromosome 11 and strip regions $B_1$ to $B_4$ of the chromosome 12 are interchanged, thereby realizing crossover. FIG. 6 shows an example of generation of a child chromosome 13 comprising strip regions $A_1$, $A_2$, $B_3$, and $A_4$, by exchanging the strip region $A_3$ of the chromosome 11 with the strip region $B_3$ of the chromosome 12. Thus, FIG. 6 shows an example of crossover effected by selecting one strip region from each of the two parent chromosomes and by interchanging the thus-selected strip regions. However, a plurality of strip regions of a single chromosome may be selected, and the thus-selected strip regions may be interchanged between chromosomes.

If non-uniformity in density in a certain strip region of the plurality of strip regions in one chromosome is reduced to a greater extent than is the non-uniformity in density in a counterpart strip region of another chromosome, the genetic operation; i.e., crossover, may be executed in the first algorithm executing step by pasting the strip region in the chromosome to the counterpart strip region of the other chromosome.

For instance, a strip region $R_i$ (i=1, . . . , N), in which non-uniformity in density of the layout elements 9 is considerable, is selected from one chromosome. If non-uniformity in density of the layout elements 9 in a counterpart strip region $R_i'$ (i=1, . . . , N) of another chromosome is lesser than that in the strip region $R_i$ (i=1, . . . , N), crossover may be effected by pasting the strip region $R_i'$ (i=1, . . . , N) to the corresponding portion of the chromosome.

With regard to non-uniformity indensity of the layout elements 9, the strip region $R_i$ of a first chromosome is fully compared with the strip region $R_i'$ of a second chromosome. If the layout elements 9 in the strip region $R_i'$ of the second chromosome are found to have lower non-uniformity in density, the strip region $R_i'$ is pasted to a counterpart portion of the first chromosome. Conversely, if the layout elements 9 in the strip region $R_i$ of the first chromosome are found to have lower non-uniformity in density, the strip region $R_i$ may be pasted to counterpart portions of another chromosome, thereby effecting crossover.

Further, in the first algorithm executing step the genetic operation; i.e., mutation, is carried out by moving at least one layout element 9 of the plurality of layout elements 9 within one strip region of the plurality of strip regions.

Figure 7:
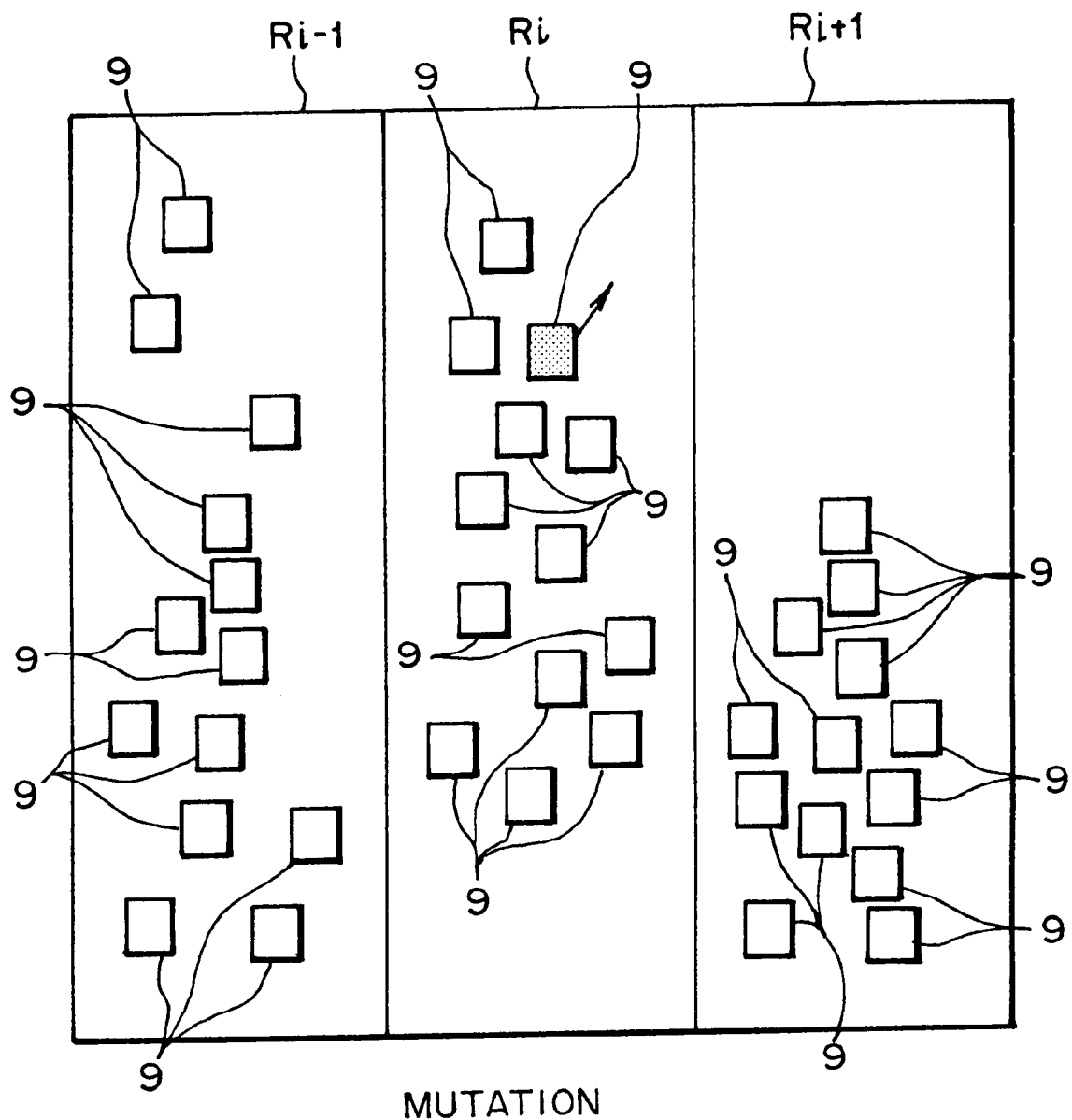
FIG. 7 shows one example of mutation carried out by a genetic algorithm (GAc) employed in the layout optimization problem processing method according to the first embodiment.

FIG. 7 shows one example of mutation. As shown in FIG. 7, a certain layout element 9 is selected with a certain probability, and the thus-selected layout element 9 is randomly moved within the strip region $R_i$ to which the layout element 9 pertains, thereby effecting mutation. In FIG. 7, the layout element 9 to be moved is crosshatched.

Finally, in the first algorithm executing step the genetic operation; i.e., selection, is carried out through use of fitness functions for enabling the chromosome which has lower non-uniformity in density of the layout elements to assume a great fitness value.

Selection is carried out by use of fitness functions defined as follows:

Fitness value=Constant−(Maximum layout element density−Minimum layout element density)    (1)

Fitness value=Constant−(Area of the layout region whose layout element density is equal to or smaller than a mean layout element density)    (2)

Fitness value=Constant−(Area of the layout region whose layout element density is equal to or greater than a mean layout element density)    (3)

The local layout unbalance reducing method (LO) will now be described by reference to FIGS. 12(a) through 17.

As mentioned previously, the local layout unbalance reducing method (LO) is intended to reduce non-uniformity in density of the layout elements 9 staying in an layout unbalance reduction halfway stage, by execution of the local layout unbalance reducing algorithm to thereby move the layout elements 9 from a high-density location to a low-density location within the sub-divided region 10a of the layout region 10. The local layout unbalance reducing method (LO) is applied to each of the chromosomes (i.e., each of the layout results).

In the first embodiment, the non-uniformity in density of the layout elements 9 is reduced by use, as the local layout unbalance reducing algorithm, of an algorithm to which the hydrodynamic analogy is applied.

According to the hydrodynamic analogy, the movement of the layout elements 9 within the sub-divided region 10a of the layout region 10 is taken as a kind of motion of fluids. The interaction of flow (or motions) of the layout elements 9 within the adjacent sub-divided regions 10a and the interaction of flow of the layout elements 9 within a single sub-divided region 10a are grasped by means of analogy to viscosity.

When the non-uniformity in density of the layout elements 9 is reduced through use of the algorithm to which the hydrodynamic analogy is applied, the layout region 10 is vertically or horizontally split at predetermined pitches into a plurality of strip regions.

Since in the first embodiment the layout region 10 has already been split into the plurality of sub-divided regions 10a at the time of execution of the genetic algorithm, the sub-divided regions 10a can be used as the strip regions without modification.

Alternatively, the layout region 10 is again split into a plurality of new split regions.

Provided that the number of vertically-split regions is N, individual sub-divided regions can be expressed as $S_1, S_2, \ldots, S_N$. Similarly, provided that the number of horizontally-split regions is M, individual sub-divided regions can be expressed as $T_1, T_2, \ldots, T_M$. The strip regions $S_i$ and $T_i$ may differ from each other in width.

Further, so long as the layout region 10 is hierarchically split into strip regions 10a, the density of the layout elements 9 can be easily made uniform. The layout region 10 is divided into smaller segments according to two methods; namely, a method of dividing the layout region in a symmetrical manner [see FIGS. 12(a) to 12(d)] and a method of dividing the layout regions in an asymmetrical manner.

If the layout region 10 is not hierarchically split but is fragmented from the beginning, processing time can be made shorter than that required by the method of hierarchically dividing the layout region.

When the layout region 10 is divided into a plurality of strip regions, the layout elements 9 located within the strip region Ti (or Si) are moved until the density of the layout elements 9 becomes uniform. More specifically, the layout elements 9 are moved from a high-density location to a low-density location in imitation of motion of fluids from a high-density location to a low-density location.

In the second algorithm executing step (i.e., step 4 shown in FIG. 2), at least one layout element 9 of the plurality of layout elements 9 arranged in an layout unbalance reduction halfway stage is moved from a high-density location to a low-density location, thereby executing the algorithm to which the hydrodynamic analogy is applied.

When the layout region 10 is divided into the plurality of sub-divided regions 10a, in the second algorithm executing step at least one layout element 9 of the plurality of layout elements 9 included in each of the sub-divided regions 10a is moved from a high-density location to the low-density location.

The following methods can be used for moving the layout elements 9.

(1) Conservation of Proximal Relationship

In terms of the fluid analogy, adjacent layout elements 9 cannot be readily separated far apart from each other because of viscosity.

Figure 14B:
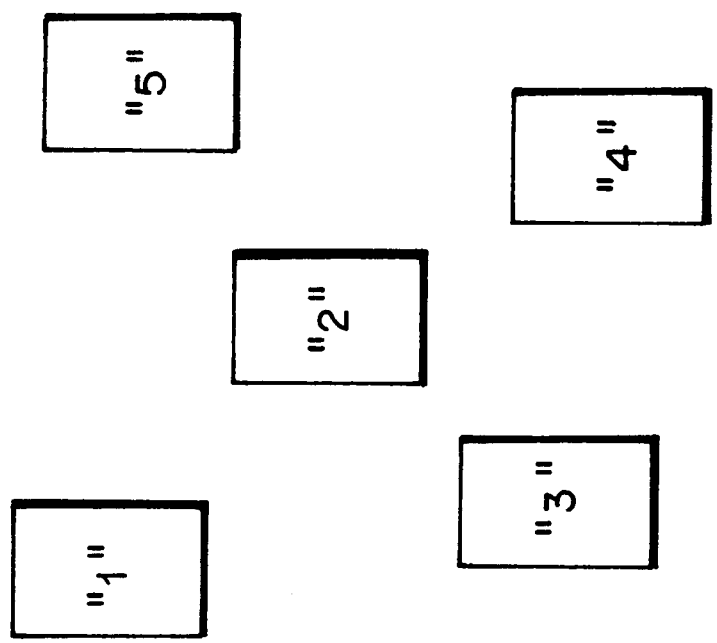
FIGS. 14(a) and 14(b) show another example of the method of moving layout elements that is used for the layout optimization problem processing method according to the first embodiment and employs an algorithm to which the hydrodynamic analogy is applied.
Figure 14A:
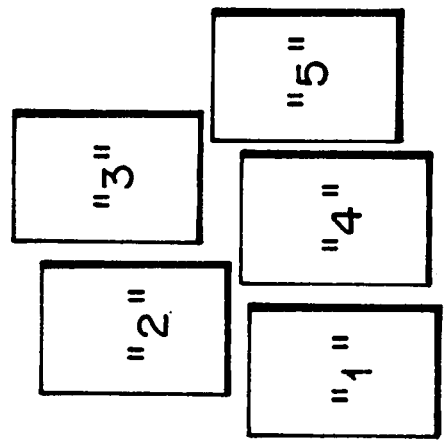

As shown in FIGS. 14(a) and 14(b), the adjacent layout elements 9 are moved so as to remain in close proximity to each other after movement.

In other words, at least one layout element 9 of the plurality of layout elements 9 can be moved in the second algorithm executing step while the proximal relationship among the plurality of layout elements 9 is conserved.

(2) Conservation of Relative Positional Relationship

Figure 15B:
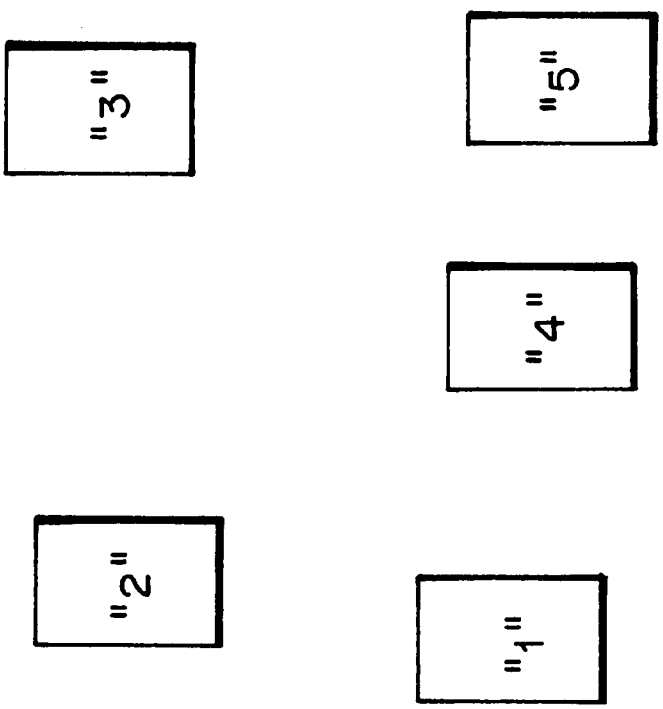
FIGS. 15(a) and 15(b) show still another example of the method of moving layout elements that is used for the layout optimization problem processing method according to the first embodiment and employs an algorithm to which the hydrodynamic analogy is applied.
Figure 15A:
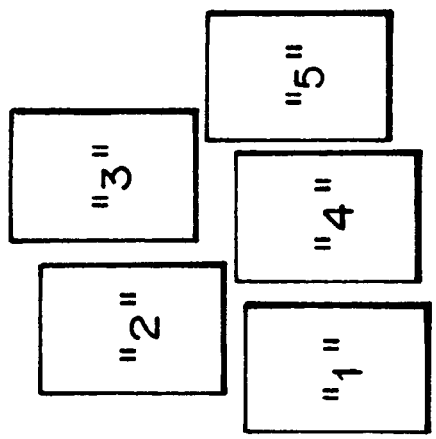
Figure 16C:
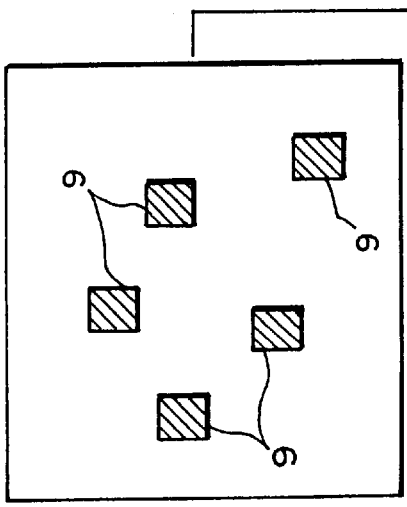
FIGS. 16(a) to 16(e) show yet another example of the method of moving layout elements that is used for the layout optimization problem processing method according to the first embodiment and employs an algorithm to which the hydrodynamic analogy is applied.
Figure 16B:
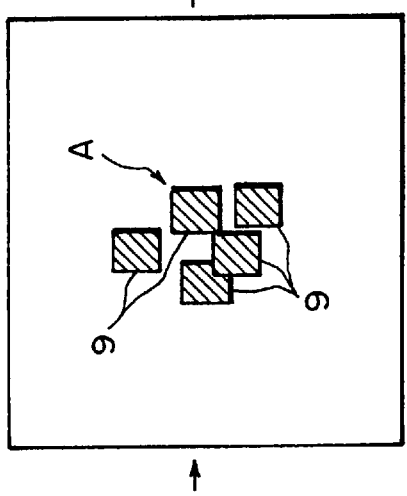
Figure 16A:
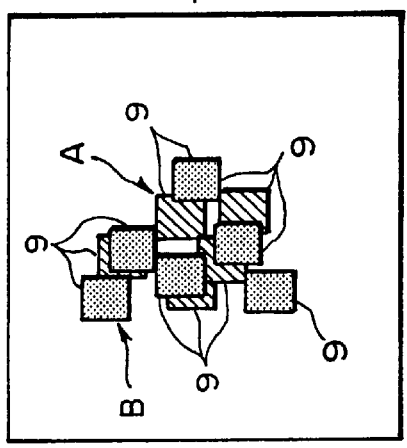
Figure 16E:
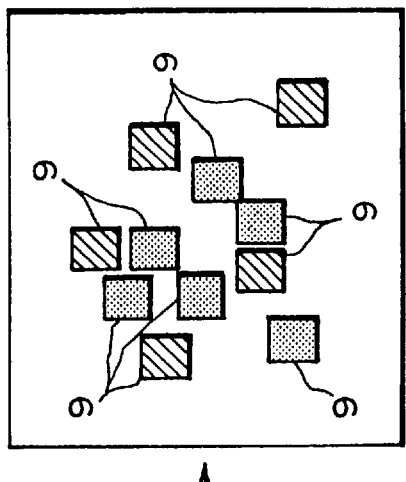
Figure 16D:
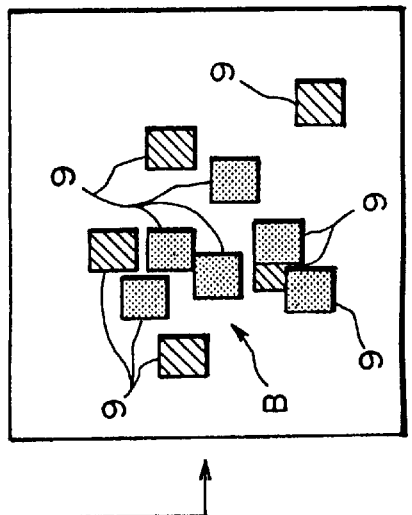

As shown in FIGS. 15(a) and 15(b), in a case where a predetermined positional relationship exists between a certain layout element 9 and another layout element 9 (for example, a certain layout element 9 is located in an upper or right-side position with respect to another layout element 9), the layout elements 9 are moved such that the positional relationship between these two layout elements 9 is maintained after movement.

The solution to the layout optimization problem has the function of conserving the relative positional relationship among the layout elements 9.

More specifically, in the second algorithm executing step at least one layout element 9 of the plurality of layout elements 9 can be moved while the relative positional relationship among the plurality of layout elements 9 is conserved.

(3) Sequential Addition Method

Consideration is given not to simultaneous movement of all the layout elements 9, but to movement of only a nominal number of layout elements. Initially, this nominal number of layout elements 9 are moved, and the density of these layout elements 9 is made uniform. Subsequently, the same number of layout elements 9 are selected from the remaining layout elements 9. The thus-selected layout elements 9 are added to the group of the layout elements 9 that have already been moved. With regard to the group of the layout elements 9 to which the layout elements 9 are newly added, the layout elements 9 are moved again so as to attain uniform density of the group of the layout elements 9.

For instance, as shown in FIG. 16(*a*), the layout elements 9 are classified into a group of layout elements 9 denoted by A and another group of layout elements 9 denoted by B. In FIG. 16(*a*), the layout elements 9 denoted by A are diagonally shaded, and the layout elements 9 denoted by B are crosshatched.

As shown in FIGS. 16(*b*) and 16(*c*), non-uniformity in density in the group of the layout elements 9 denoted by A is reduced. Subsequently, as shown in FIG. 16(*d*), the group of the layout elements 9 denoted by B is added to the group of the layout elements 9 whose non-uniformity in density has been reduced. As shown in FIG. 16(*e*), non-uniformity in density in the group of the layout elements 9 denoted by B is then reduced.

In the second algorithm executing step, the layout elements 9 to be subjected to reduction of non-uniformity in density can be sequentially added at the time of reduction of non-uniformity in density of the plurality of layout elements 9 staying in an layout unbalance reduction halfway stage.

(4) Consideration to Stationary Layout Element

A stationary layout element corresponds to a layout element 9 which cannot be moved. In a case where a stationary layout element exists, the density of the layout elements around the stationary layout element tends to become higher by movement of only the layout elements 9 other than the stationary layout element without consideration to the stationary layout element.

To prevent the layout elements 9 from concentrating in the vicinity of a stationary layout element, if a stationary layout element is included in the plurality of layout elements 9, desirably the stationary layout element is also read, in the second algorithm executing step, to be a layout element 9 to be subjected to reduction of non-uniformity in density, thereby reducing non-uniformity in density of the plurality of layout elements 9 arranged in an layout unbalance reduction halfway stage.

(5) Consideration to Large-sized Layout Element

In a case where a large-sized layout element which accounts for a large proportion of the layout region 10 as compared with other layout elements 9, if this large-sized layout element is moved, the layout element is apt to be superimposed on a plurality of layout elements 9, which in turn may significantly increase the density of layout elements.

To prevent such an increase in the density of layout elements, the distance over which the large-sized layout element is moved is made comparatively smaller than that over which the other layout elements 9 are moved.

More specifically, in a case where a large-sized layout element exists among the plurality of layout elements 9, desirably non-uniformity in density of the plurality of layout elements 9 staying in an layout unbalance reduction halfway stage is reduced in the second algorithm executing step.

Figure 17:
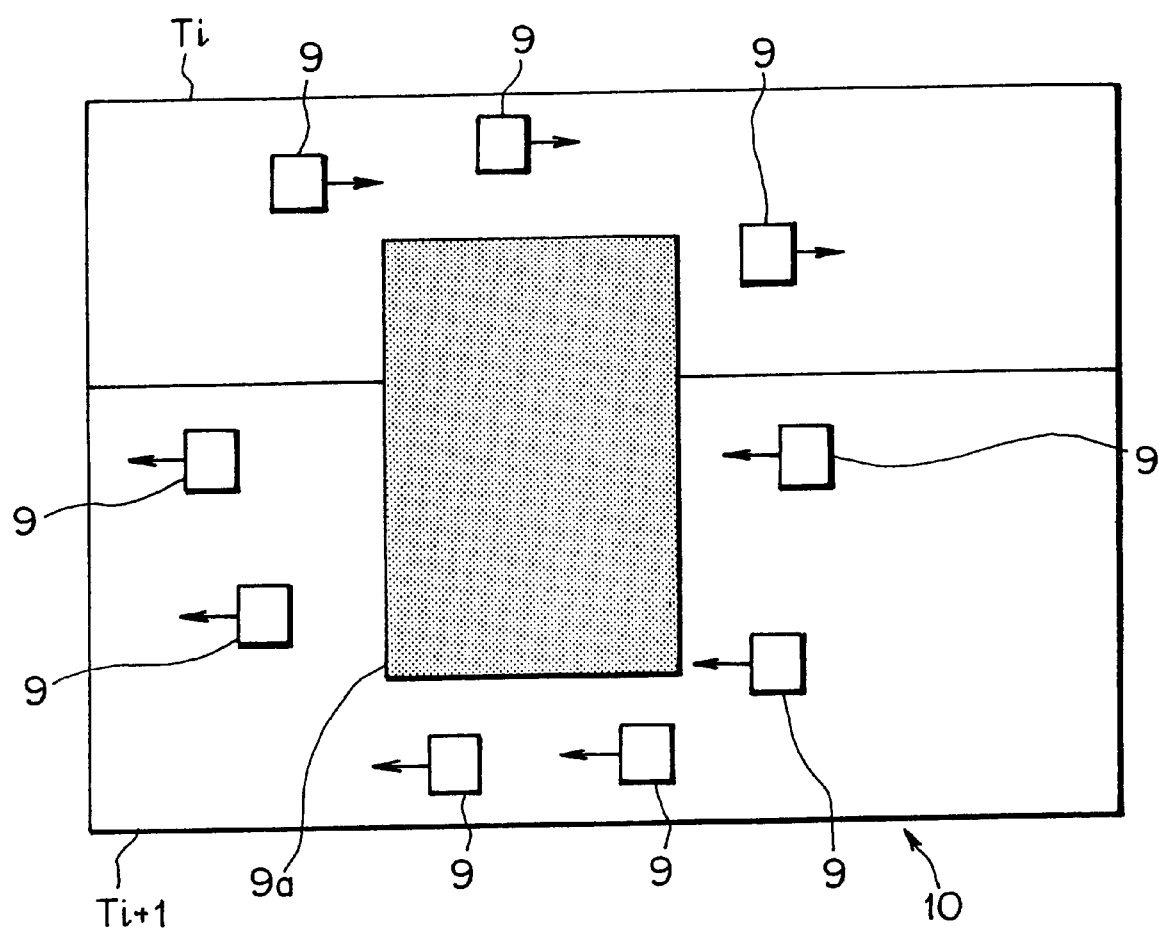
FIG. 17 shows another example of the method of moving layout elements that is used for the layout optimization problem processing method according to the first embodiment and employs an algorithm to which the hydrodynamic analogy is applied.

As shown in FIG. 17, in a case where a large-sized layout element 9*a* exists within the layout region 10 so as to extend across the strip regions $T_i$ and $T_{i-1}$, care must be taken. Particularly, when the layout elements 9 positioned around the large-sized layout element 9*a* in the strip region Ti move in the direction opposite to the direction of movement of the layout elements 9 positioned around the large-sized layout element 9*a* in the strip region $T_{i-1}$, care must be taken not in moving the large-sized layout element 9*a*.

(6) Method of Reducing Non-Uniformity in Density in a Strip Region having a High Density of Layout Elements In connection with reduction of non-uniformity in density of the layout elements in a strip region $S_i$ (or $T_i$) having a high layout-element density, two methods are followed; namely, in one method, the high-density strip region $S_i$ (or $T_i$) is reduced by simultaneous movement of all the layout elements 9 (at one time), and in another method the density of layout elements is reduced stepwise by gradual (or stepwise) movement of the layout elements 9.

In the second algorithm executing step, at the time of reduction of non-uniformity in density of the plurality of layout elements 9 staying in an layout unbalance reduction halfway stage, the layout elements 9 to be moved may be simultaneously moved or may be moved gradually.

Under the layout optimization problem processing method according to the first embodiment, when data regarding the plurality of layout elements 9 staying in an initial layout are entered in the first algorithm executing step, the genetic algorithm (GAc) is executed, and the non-uniformity in density of the layout elements 9 staying in the initial layout is reduced.

If the data regarding the plurality of layout elements 9 being staying in the layout unbalance reduction halfway stage are entered after the non-uniformity in density of the layout elements 9 has been reduced in the first algorithm executing step, the local layout unbalance reducing algorithm is executed in the second algorithm executing step, thereby further reducing the non-uniformity in density of the plurality of layout elements 9 staying in an layout unbalance reduction halfway stage.

As mentioned above, as a result of execution of the processing relating to the first algorithm executing step and the processing relating to the second algorithm executing step, the plurality of layout elements 9 are arranged in the layout region 10, thereby enabling solution of the layout optimization problem.

As mentioned, the layout optimization problem processing method according to the first embodiment employs, in combination, the layout unbalance reducing method using the genetic algorithm (GAc) and the local layout unbalance reducing method (LO) using the algorithm to which the hydrodynamic analogy is applied. The processing speed of the genetic algorithm (GAc) can be increased by acceleration of an increase in fitness of the chromosomes.

Since crossover suitable for reducing the non-uniformity in density of the layout elements 9 is performed during the genetic algorithm (GAc), a solution can be produced efficiently, and an optimum solution can be efficiently retrieved.

Further, in the second algorithm executing step, the layout elements 9 can be moved while the proximal relationship among the plurality of layout elements 9 is conserved, and the plurality of layout elements 9 can be moved while the relative positional relationship among the plurality of layout elements 9 is conserved. Therefore, the range of layout optimization problems capable of being processed can be enlarged.

In the second algorithm executing step, the layout elements 9 to be subjected to non-uniformity in density reduction are sequentially added at the time of reduction of non-uniformity in density of the layout elements 9; a stationary layout element is read as the layout element 9 to be subjected to reduction of non-uniformity in density; the distance over which the large-sized layout element 9 is moved is reduced; all the layout elements 9 to be moved are moved simultaneously; and the layout elements 9 to be moved are gradually moved. Consequently, the range of layout optimization problems capable of being processed can be enlarged.

The foregoing description has explained the combination of the layout unbalance reducing method using the genetic algorithm (GAc) and the local layout unbalance reducing method (LO) by execution of the local layout unbalance reducing method (LO) in the second algorithm executing step after the layout unbalance reducing method using the genetic algorithm (GAc) has been executed in the first algorithm executing step. The layout unbalance reducing method using the genetic algorithm (GAc) and the local layout unbalance reducing method (LO) may be used in combination by execution of the local layout unbalance reducing algorithm in the second algorithm executing step during execution of the genetic algorithm (GAc) in the first algorithm executing step.

Figure 18:
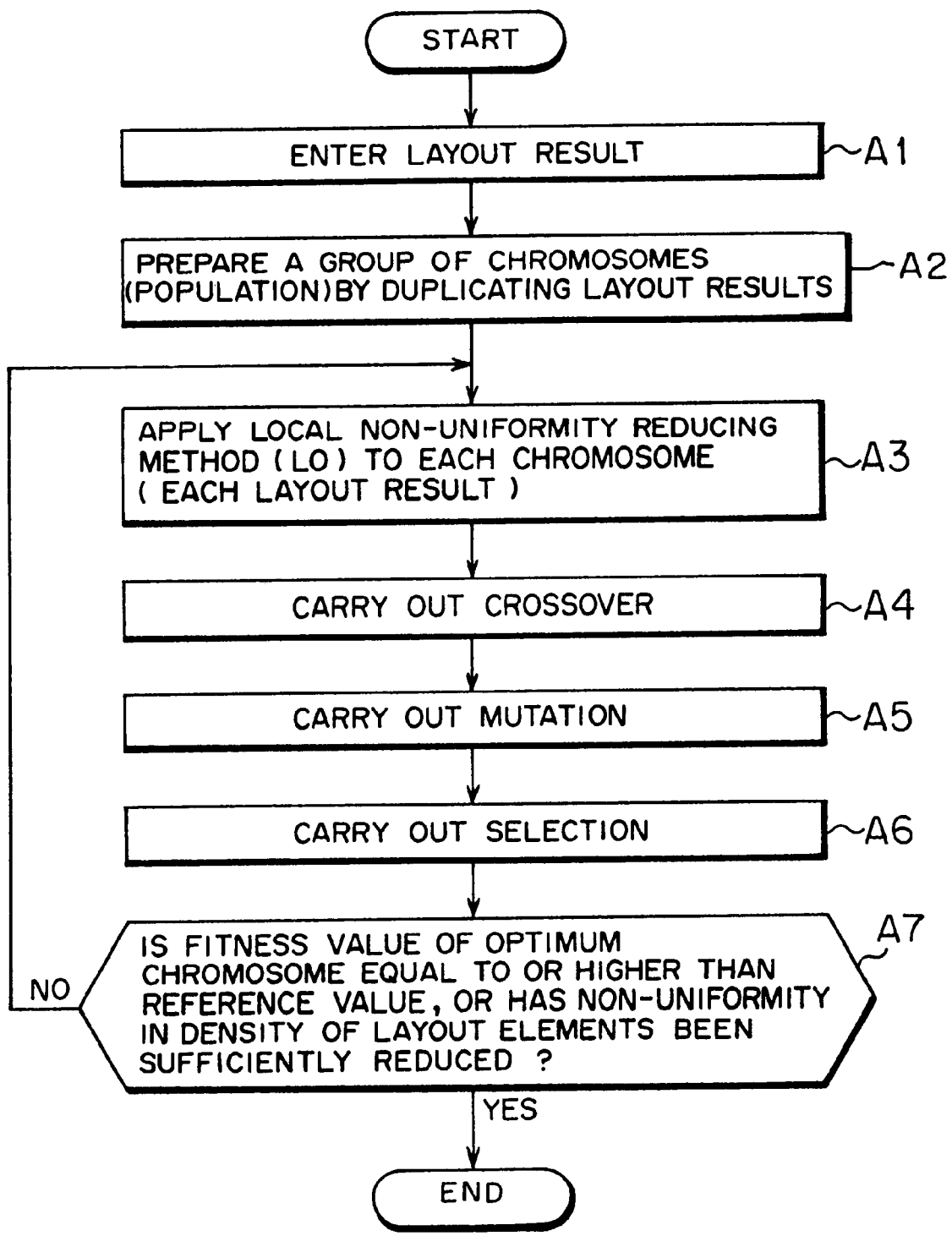
FIG. 18 is a flowchart for describing another example of the layout optimization problem processing method according to the first embodiment.

The operation of such a layout optimization problem processing system 1 will now be described by reference to the flowchart provided in FIG. 18.

First, the result of arrangement of the plurality of layout elements 9 in the initial layout (i.e., the data regarding the state of the layout elements 9 staying in the initial arrangement) is input to the layout optimization problem processing system 1 (step A1).

Upon receipt of the initial layout result regarding the layout elements 9, the layout optimization problem processing system 1 prepares a group of chromosomes by duplication of the layout result in the first algorithm executing step (step A2).

Subsequently, in the second algorithm executing step, the chromosomes (i.e., the layout results) are subjected to the local layout unbalance reducing methods (LO), which are identical with one another in terms of the manner of dividing the layout region 10 but comprise different control parameters (step A3). The local layout unbalance reducing method (LO) is executed through use of an algorithm to which the hydrodynamic analogy is applied.

Further, the individual chromosomes undergo genetic operations; i.e., crossover, mutation, and selection in the first algorithm executing step (steps A4 to A6). In this way, a determination is made as to whether or not the fitness value of the chromosome having the highest fitness value (i.e., the most optimum chromosome) is equal to or greater than a predetermined reference value, or as to whether or not non-uniformity in density in the layout result is reduced (step A7).

If it is determined that the fitness value of the most optimum chromosome is not equal to or greater than the predetermined reference value or that the non-uniformity in density in the layout result has not yet been reduced (i.e., when NO is selected in step A7), the layout elements are again subjected to the processing operations subsequent to the processing relating to step A3. In contrast, when it is determined that the fitness value of the most optimum chromosome is equal to or greater than the predetermined reference value or that the non-uniformity in density in the layout result has been reduced, the optimum chromosome is output as a solution to the layout optimization problem. Thus, the processing of the layout optimization problem processing system 1 is completed (when YES is selected in step A7).

Advantageous results similar to those mentioned previously may be yielded through the foregoing processing steps.

As shown in FIGS. 13(*a*) to 13(*c*), at the time of execution of the local layout unbalance reducing method (LO) through use of the algorithm to which the hydrodynamic analogy is applied, there may be carried out vertical dividing of a certain layout region 10; moving of the individual layout elements 9 in the layout region 10; horizontal dividing of another layout region 10; moving the individual layout elements 9 within the other layout region 10; taking, as a vector, movement of a specific layout element 9 in the vertically-split layout region (i.e., the direction in which the layout element 9 is moved and the distance over which the layout element 9 is moved); taking, as a vector, movement of the specific layout element 9 within the horizontally-split layout region (i.e., the direction in which the layout element 9 is moved and the distance over which the layout element 9 is moved); merging these two vectors into a single vector to thereby obtain the direction in which the specific layout element 9 is moved and the distance over which the specific layout element 9 is moved; and moving the specific layout element 9 on the basis of the thus-obtained direction and distance.

(b3) Description of Modification of the First Embodiment

The previous first embodiment has described such that, at the time of execution of the local layout unbalance reducing method (LO), the algorithm to which the hydrodynamic analog is applied is used as the local layout unbalance reducing algorithm in the second algorithm executing step. However, another algorithm to which a morphing analogy is applied may also be used as the local layout unbalance reducing algorithm in the second algorithm executing step.

Morphing analogy is an imitation of an image processing technique for gradually deforming a two-dimensional image into another image; i.e., morphing. According to the morphing analogy, the movement of the layout elements 9 within the sub-divided region 10*a* of the layout region 10 is taken as deforming action of morphing. In contrast with morphing relating to the image processing technique, the layout elements 9 per se do not change in size or shape, and only the coordinates of the layout elements 9 in the layout region 10 are changed.

Figure 19:
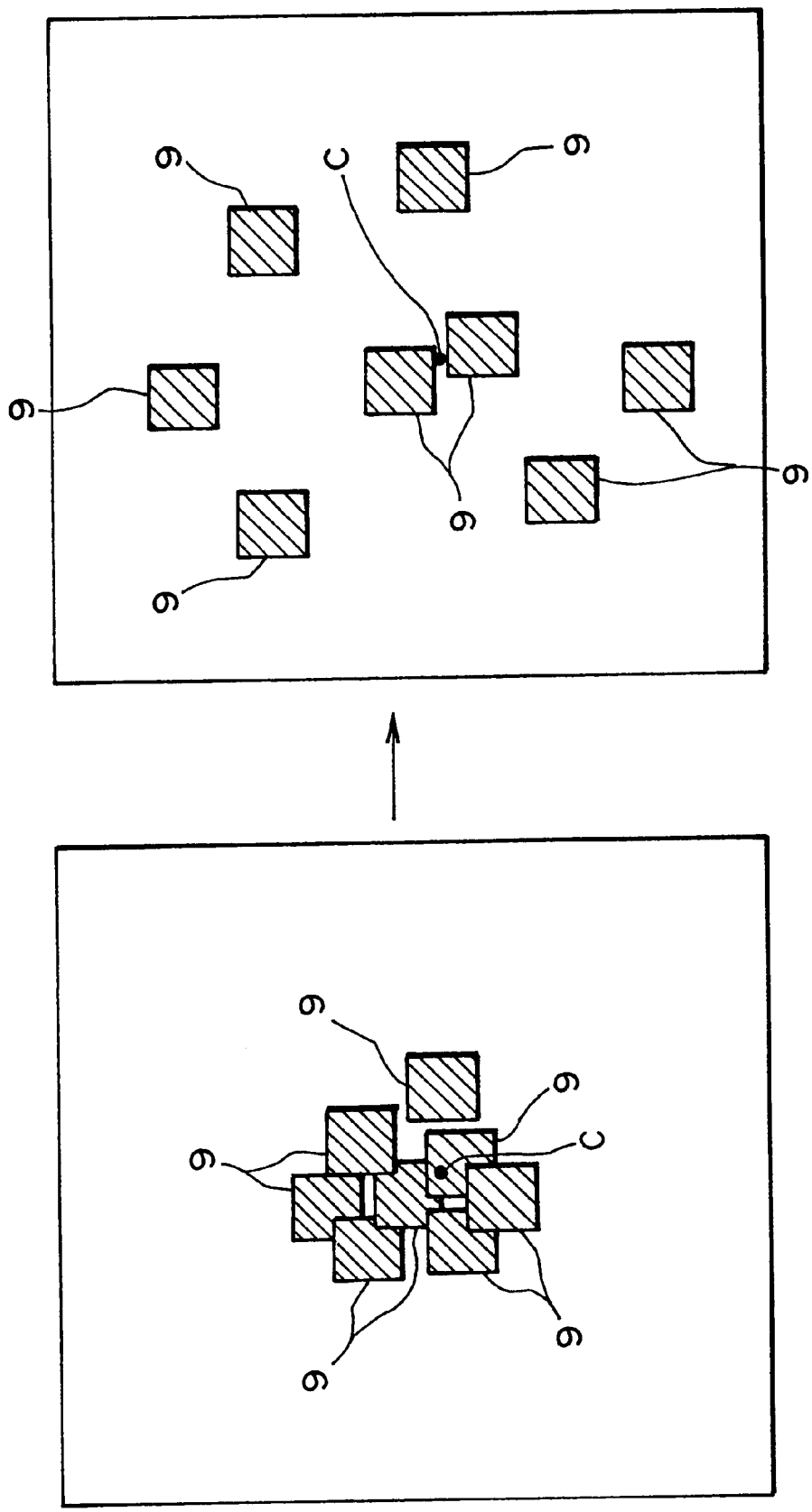
FIGS. 19(a) and 19(b) show one example of a method of moving layout elements that is used for the layout optimization problem processing method according to a modification of the first embodiment and employs an algorithm to which a morphing analogy is applied.

At the time of reduction of the non-uniformity in density of the layout elements 9 by means of the morphing analogy, the layout region 10 is divided into strip regions in the manner as described in the first embodiment. As shown in FIG. 19(*a*), the center point C (i.e., the center of morphing) used at the time of moving the layout elements 9 is determined within each of the strip regions 10*a*. As shown in FIG. 19(*b*), the distance among the layout elements 9 is increased by incrementing the coordinates of the layout elements 9 according to the distance from each of the respective layout elements 9 to the center point C while the relative positional relationship among the layout elements 9 is maintained. Further, the layout elements 9 are moved in the directions in which they are to be moved (i.e., so as to be arranged along a radial direction from the center point C to the directions in which the layout elements 9 are to be located).

The center point C of morphing is determined according to any one of the following methods.

(1) Method that Uses the Centroid of the Layout Elements 9

Under this method, the centroid of the layout elements 9 is taken as the center of morphing.

Specifically, provided that the coordinates of the individual layout elements 9 are expressed by $(x_1, y_1)$ $(x_2, y_2), \ldots, (x_{M'}, y_{M'})$, the centroid of the layout elements 9 is taken as the center of morphing; that is, $$\left( \sum_{i=1}^{M'} x_1 / M', \sum_{i=1}^{M'} y_1 / M' \right)$$

(2) Method Based on the Number of Layout Elements 9

In each of the strip regions of the layout region 10, there are determined a line which is normal to the X axis of the strip region and divides the strip region into two parts containing equal numbers of layout elements 9 (i.e., a line which is perpendicular to the X axis and divides the layout region in the X direction into two parts having equal numbers of layout elements 9) and a line which is normal to the Y axis of the strip region and divides the strip region into two parts containing equal numbers of layout elements 9 (i.e., a line which is perpendicular to the Y axis and divides the layout region 10 in the Y direction into two parts having equal numbers of layout elements 9). A point of intersection of these two lines is taken as the center of morphing.

(3) Method Based on the Area of the Layout Elements 9

Within each of the strip regions of the layout region 10, there is determined a line which is normal to the X axis of the strip region and divides the strip region into two parts equal in terms of the area occupied by the layout elements 9 (i.e., a line which is perpendicular to the X axis and divides the layout region 10 in the X direction into two parts which are equal in terms of the area of layout elements 9 contained therein) and a line which is normal to the Y axis of the strip region and divides the strip region into two parts equal in terms of the area occupied by the layout elements 9 (i.e., a line which is perpendicular to the Y axis and divides the layout region 10 in the Y direction into two parts which are equal in terms of the area of layout elements 9 contained therein). A point of intersection of these two lines is taken as the center of morphing.

More specifically, in the second algorithm executing step, the center point C is determined on the basis of the data regarding the plurality of layout elements 9 staying in the layout unbalance reduction halfway stage (that is, the centroid, total number, and total area of the layout elements 9). At least one layout element 9 of the plurality of layout elements 9 is moved to a location distant from the center point C, thereby executing the algorithm to which the morphing analogy is applied.

When the layout region 10, within which the plurality of layout elements 9 are arranged, is divided into a plurality of strip regions (or the sub-divided regions 10a), the center point C is determined for each of the strip regions in the second algorithm executing step. Within the strip region, at least one layout element 9 of the plurality of layout elements 9 arranged in the strip region is moved to a position distant from the center point C.

Determination of the distance over which the layout element 9 is moved will now be described.

(1) Linear Enlargement of the Distance Over which the Layout Elements 9 are Moved The layout element 9 is moved along an extension (i.e., in a linear manner) of the direction from the center point C to the layout element 9 in proportion to the distance between the center point C of morphing to the center of the layout element 9.

Specifically, in the second algorithm executing step, at the time of movement of at least one layout element 9 of the plurality of layout elements 9 to a position distant from the center point C, the distance between the center point C and the position of the layout element 9 to be moved is enlarged linearly.

(2) Non-linear Enlargement of the Distance Over Which the Layout Element 9 is Moved At the time of movement of the layout element 9 in the direction from the center point C of morphing to the layout element 9, the distance over which the layout element 9 is moved is defined as a non-linear function proportion to the distance between the center point C and the center of the layout element 9.

More specifically, the non-uniformity in density of the layout elements 9 located in the vicinity of the center point C is great, and hence the distance over which these layout elements 9 are moved is made large. In contrast, in order to move the layout elements 9 within the sub-divided strip region (or the sub-divided region 10a), the distance over which the layout elements 9 located in the vicinity of the boundary of the strip region is made small.

In the second algorithm executing step, at the time of movement of at least one layout element 9 of the plurality of layout elements 9 from the center point C to a location distant from the center point C, the distance between the center point C and the position of the layout element 9 to be moved can be non-linearly enlarged.

Advantageous results similar to those yielded in the first embodiment can be yielded by execution of the local layout unbalance reducing method (LO) through use of the algorithm to which such morphing analogy is applied.

Further, in the second algorithm executing step, the distance from the center point C to the layout element 9 to be moved can be linearly and non-linearly enlarged at the time of movement of the layout element 9 to a location distant from the center point C, thereby enlarging the range of the layout optimization problems capable of being solved.

Even in the layout optimization problem processing method according to the modification of the first embodiment, as has been described by reference to the first embodiment, the sequential addition method may be employed, consideration may be given to a stationary layout element and a large-sized layout element, the layout elements 9 may be moved simultaneously, and the layout elements 9 may be moved gradually.

(b4) Description of Second Embodiment

A layout optimization problem processing method according to a second embodiment of the present invention will now be described.

Under the layout optimization problem processing method according to the second embodiment, the genetic algorithm (GAp) is executed in the first algorithm executing step (i.e., step S3 shown in FIG. 2), and the algorithm which is described in the first embodiment and to which the hydrodynamic analogy is applied is executed as the local layout unbalance reducing algorithm in the second algorithm executing step (i.e., step S4 shown in FIG. 2).

The genetic algorithm (GAp) executed in the second embodiment is intended to optimize the width to which the layout region 10 is divided by the local layout unbalance reducing method (LO).

More specifically, the layout optimization problem processing method according to the second embodiment is intended to optimize the division of the layout regions 10 to thereby efficiently reduce non-uniformity in density of the layout elements 9 by application of the genetic algorithm (GAp) to each chromosome; the chromosome comprises a list of widths—width being a parameter of the local layout unbalance reducing method (LO)—into which the layout region 10 is divided.

In other words, in order to optimize the method of dividing the layout region 10, the method is to efficiently reduce non-uniformity in density of the layout elements 9 by optimization of the parameter (i.e., the lateral width of the layout region 10) used in the local layout unbalance reducing method (LO) through use of the genetic algorithm (GAp), while a given layout is taken as an initial layout.

Here, this layout optimization problem processing method may be labeled GAp+LO.

In the second embodiment, in the first algorithm executing step, the genetic algorithm (GAp) is executed by expressing, as a gene, the parameter used by the local layout unbalance reducing algorithm that is executed in the second algorithm executing step and by use of a chromosome including the sequence of the gene as a candidate for a solution to the problem, which determines the parameter.

The parameter comprises data for specifying the widths into which the layout region 10 is divided (i.e., data for specifying the size of the sub-divided region 10a), and control parameters used for another local layout unbalance reducing method (LO).

Specifically, the genetic algorithm (GAp) employs a chromosome comprising a list of data sets which determine the widths of the sub-divided regions 10a and a list of control parameters used for other local layout unbalance reducing methods (LO).

Figure 20:
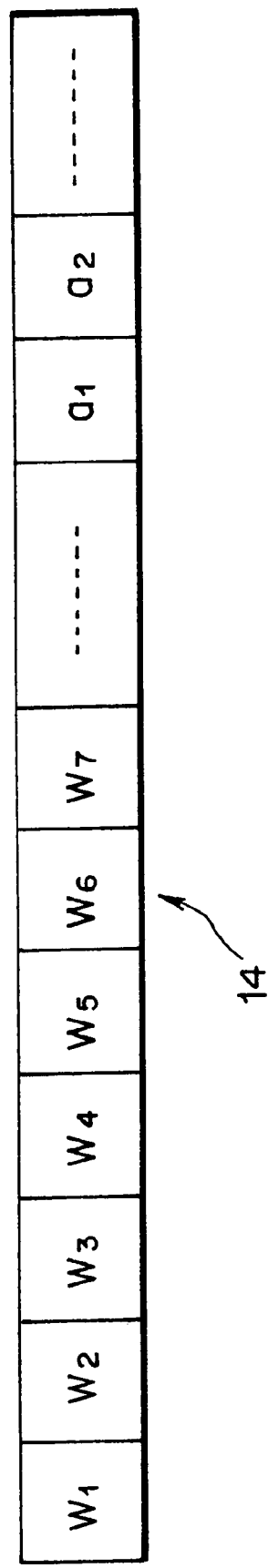
FIG. 20 shows one example of a chromosome for a genetic algorithm (GAp) used in a layout optimization problem processing method according to a second embodiment of the present invention.

FIG. 20 shows the configuration of a chromosome comprising the widths of the strip regions $S_1, S_2, \ldots, S_N$ as $W_1, W_2, \ldots, W_N$ into which the layout region 10 may be vertically divided. The total sum of the widths $W_1, W_2, \ldots, W_N$ must be equal to the lateral width of the layout region 10. The chromosome 14 further comprises control parameters $a_1$ and $a_2$ used for another local layout unbalance reducing method.

In the first algorithm executing step, a weighted average between genes of two parent chromosomes is taken as a gene of a child chromosome, thereby executing crossover as a genetic operation.

Figure 21:
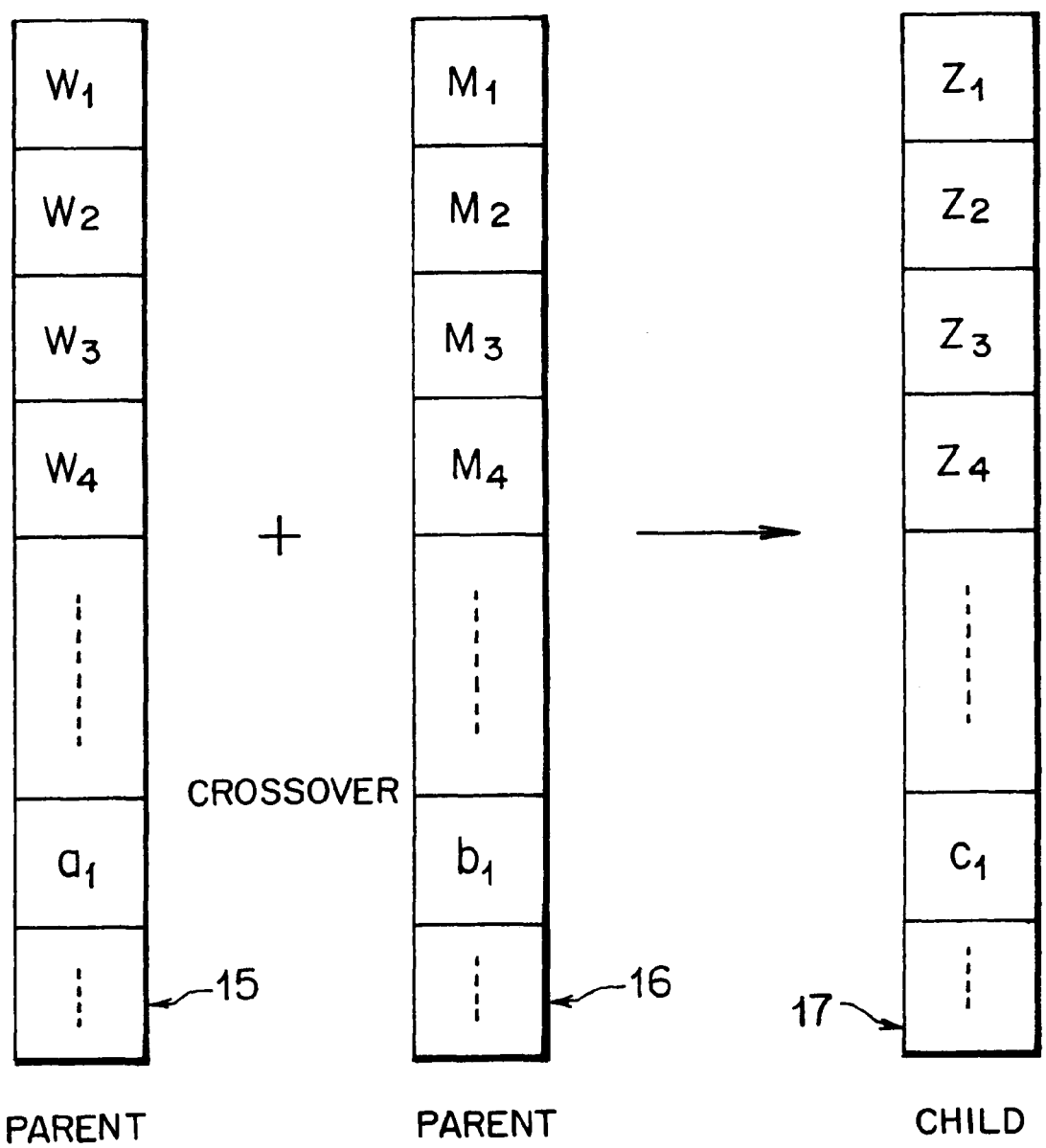
FIG. 21 shows one example of crossover effected by a genetic algorithm (GAp) which used in a layout optimization problem processing method according to a second embodiment of the present invention.

FIG. 21 shows one example of crossover. As shown in FIG. 21, chromosomes 15 and 16 are stochastically selected as parent chromosomes, and duplications of the parent chromosomes are prepared. A weighted average of the genes of the chromosomes 15 and 16 is prepared, and the thus-prepared weighted average is taken as the gene of a child chromosome 17, thereby executing crossover.

In FIG. 21, $W_1$ to $W_4$ . . . represent the widths of the strip regions $S_1, S_2, \ldots, S_N$ of the parent chromosome 15; $M_1$ to $M_4$ . . . represent the widths of the strip regions $S_1, S_2, \ldots, S_N$ of the parent chromosome 16; and $Z_1$ to $Z_4$ . . . represent the widths of the strip regions $S_1, S_2, \ldots S_N$ of the child chromosome 17. Further, $a_1 \ldots$ , represent control parameters used for another local layout unbalance reducing method (LO); $b_1 \ldots$ , represent control parameters used for still another local layout unbalance reducing method (LO); and $c_1 \ldots$ , represent control parameters used for yet another local layout unbalance reducing method (LO).

Here, $Z_i = (W_i + M_i)/2$ . . .  (4)

$c_i = (a_i + b_i)/2$ . . .  (5)

In the first algorithm executing step, crossover may be executed as a genetic operation by pasting a portion of the strip region of a chromosome to a counterpart portion of the strip region of another chromosome while the total sum of data sets for specifying the widths of the sub-divided regions 10a included in the control parameter is not changed.

For example, when a portion of a first chromosome is pasted to a counterpart portion of a second chromosome, crossover is executed by controlling the gene originally included in the second chromosome so as not to change the total sum of widths $W_1, W_2, \ldots, W_N$. The same also applies to a case where one portion of the second chromosome is pasted to a counterpart portion of the first chromosome.

In the first algorithm executing step, at least two genes are selected from the chromosomes, and an arbitrary numerical value is added to one of the thus-selected genes, thereby executing mutation as a genetic operation while the total sum of data sets for specifying the widths of the sub-divided regions 10a included in the control parameter is unchanged.

Mutation is caused by randomly imparting a minute change in the gene of the chromosome. More specifically, a predetermined number is added to one of the selected genes, and a predetermined number is subtracted from the other gene, thereby executing mutation while the total sum of the data sets for specifying the widths of the sub-divided regions 10a is unchanged.

Figure 22:
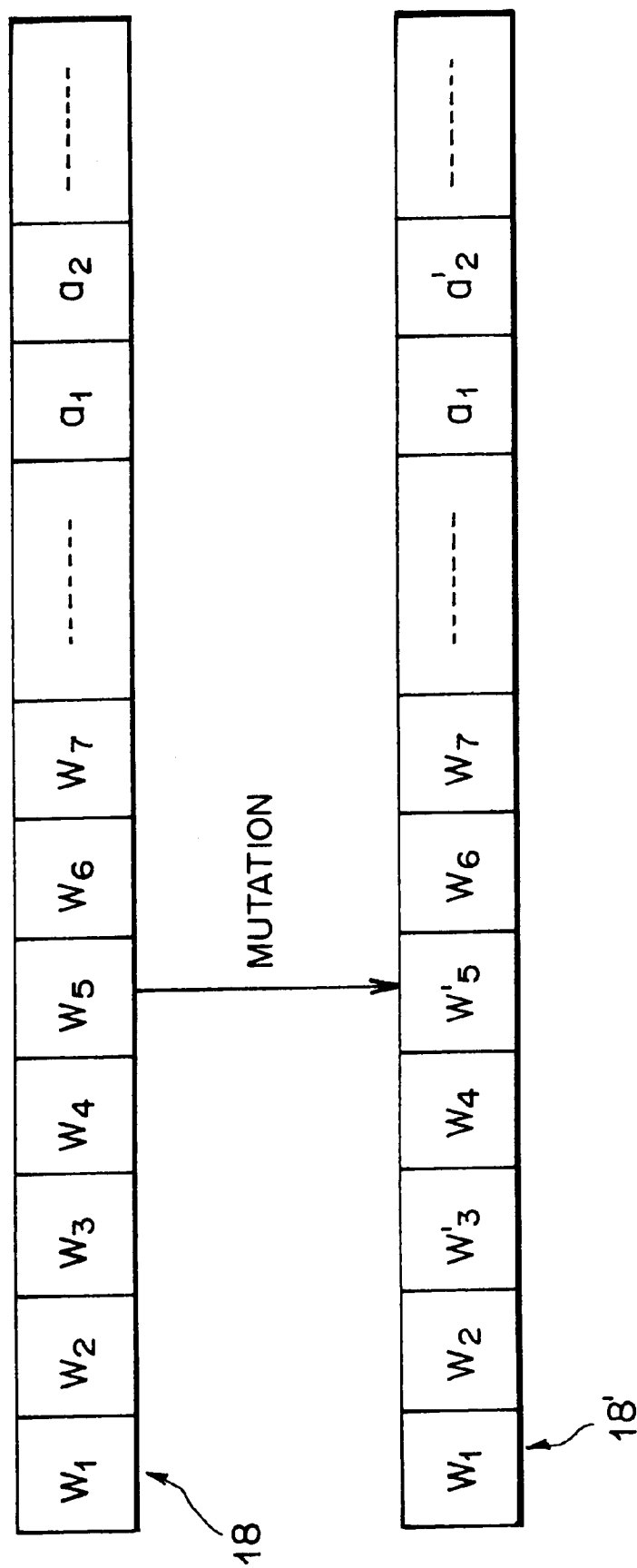
FIG. 22 shows one example of mutation effected by a genetic algorithm (GAp) which used in a layout optimization problem processing method according to the second embodiment of the present invention.

FIG. 22 shows one example of mutation. As shown in FIG. 22, two genes $W_3$ and $W_5$ of a chromosome 18 are arbitrarily selected, and a small positive random number $\Delta W$ is added to the gene $W_5$, and this random number $\Delta W$ is subtracted from the gene $W_3$. As a result, the chromosome 18 is changed to another chromosome 18' while the total sum of data sets for specifying the widths of the sub-divided regions 10a is unchanged. In the example shown in FIG. 22, the chromosome 18 also undergoes mutation by addition of a random number $\Delta a$, comprising a small absolute value, to the other control parameter $a_2$ used for the local layout unbalance reducing method (LO).

In general, provided that two arbitrary genes of a chromosome are taken as $W_i$ and $W_j$, a small positive random number is taken as $\Delta W$, and genes of the chromosome that has undergone mutation are taken as $W_i'$ and $W_j'$; the genes $W_i'$ and $W_j'$ can be expressed by $$W_i' = W_i - \Delta W \tag{6}$$

$$W_j' = W_j - \Delta W \tag{7}$$

In the first algorithm executing step, an arbitrary number ("m") of genes in a chromosome may be selected as $W_{i1}, W_{i2}, \ldots, W_{im}$. These genes $W_{i1}, W_{i2}, \ldots, W_{im}$ may undergo mutation through use of random numbers $\Delta W_{i1}, \Delta W_{i2}, \ldots, \Delta W_{im}$ comprising small absolute values, thereby producing genes $W_{i1}', W_{i2}', \ldots, W_{im}'$.

At this time, the genes $W_{i1}', W_{i2}', \ldots, W_{im}'$ can be expressed by $$W_{ik}' = W_{ik} + \Delta W_{ik} \tag{8}$$

where $\Delta W_{i1} + \Delta W_{i2} + \ldots + \Delta W_{im} = 0$.

As mentioned above, in the second embodiment, a plurality of optimum candidate widths into which the layout region 10 is to be divided (i.e., candidates for optimum widths) are obtained by execution of the genetic algorithm (GAp) in the first algorithm executing step.

Subsequently, the layout regions 10 are divided in the second algorithm executing step through use of the plurality of candidates for the optimum width obtained in the first algorithm executing step, and the local layout unbalance reducing method (LO) is carried out, whereby an attempt is made to reduce the non-uniformity in density of the layout elements 9 staying in the initial layout.

In the second embodiment, processing returns to the processing relating to the first algorithm executing step. In this first algorithm executing step, selection is executed as a genetic operation through use of a fitness function defined as follows (i.e., a fitness function which enables a chromosome capable of reducing non-uniformity in density of the plurality of layout elements 9 to assume a high fitness value). Consequently, there is selected a chromosome resulting from reduction of the greatest amount of non-uniformity in density in the initial layout.

Fitness value=Constant−(Maximum layout element density−Minimum layout element density) (9)

Fitness value=Constant−(Area of the layout region whose layout element density is equal to or smaller than a mean layout element density) (10)

Fitness value=Constant−(Area of the layout region whose layout element density is equal to or greater than a mean layout element density) (11)

The local layout unbalance reducing method (LO) is improved by use of these fitness functions, which in turn enables an improvement in reduction of non-uniformity in density of the layout elements 9.

Under the layout optimization problem processing method according to the second embodiment, the first algorithm executing step and the second algorithm executing step are carried out in combination, thereby obtaining an optimum width which is a parameter used for executing the local layout unbalance reducing algorithm. As a result, the non-uniformity in density of the layout elements 9 staying in the initial layout is reduced.

Thus, the layout optimization problem of optimally arranging the plurality of layout elements 9 in the layout region 10 can be processed.

As mentioned above, under the layout optimization problem processing method according to the second embodiment, the dividing of the layout regions 10 is optimized by means of the genetic algorithm (GAp), thereby efficiently reducing the non-uniformity in density of the layout elements 9.

The plurality of layout regions 10 are divided into various widths specified by the individual chromosomes obtained through execution of the genetic algorithm (GAp), and different local layout unbalance reducing methods (LO) are applied to the plurality of layout regions 10, thereby determining the optimum local layout unbalance reducing method (LO). Thus, the optimum method of dividing the layout regions 10 may be retrieved.

As will be described later, the genetic algorithm (GAp) and the local layout unbalance reducing method (LO) may be used in combination by execution of the local layout unbalance reducing algorithm in the second algorithm executing step while the genetic algorithm (GAp) is executed in the first algorithm executing step.

Figure 23:
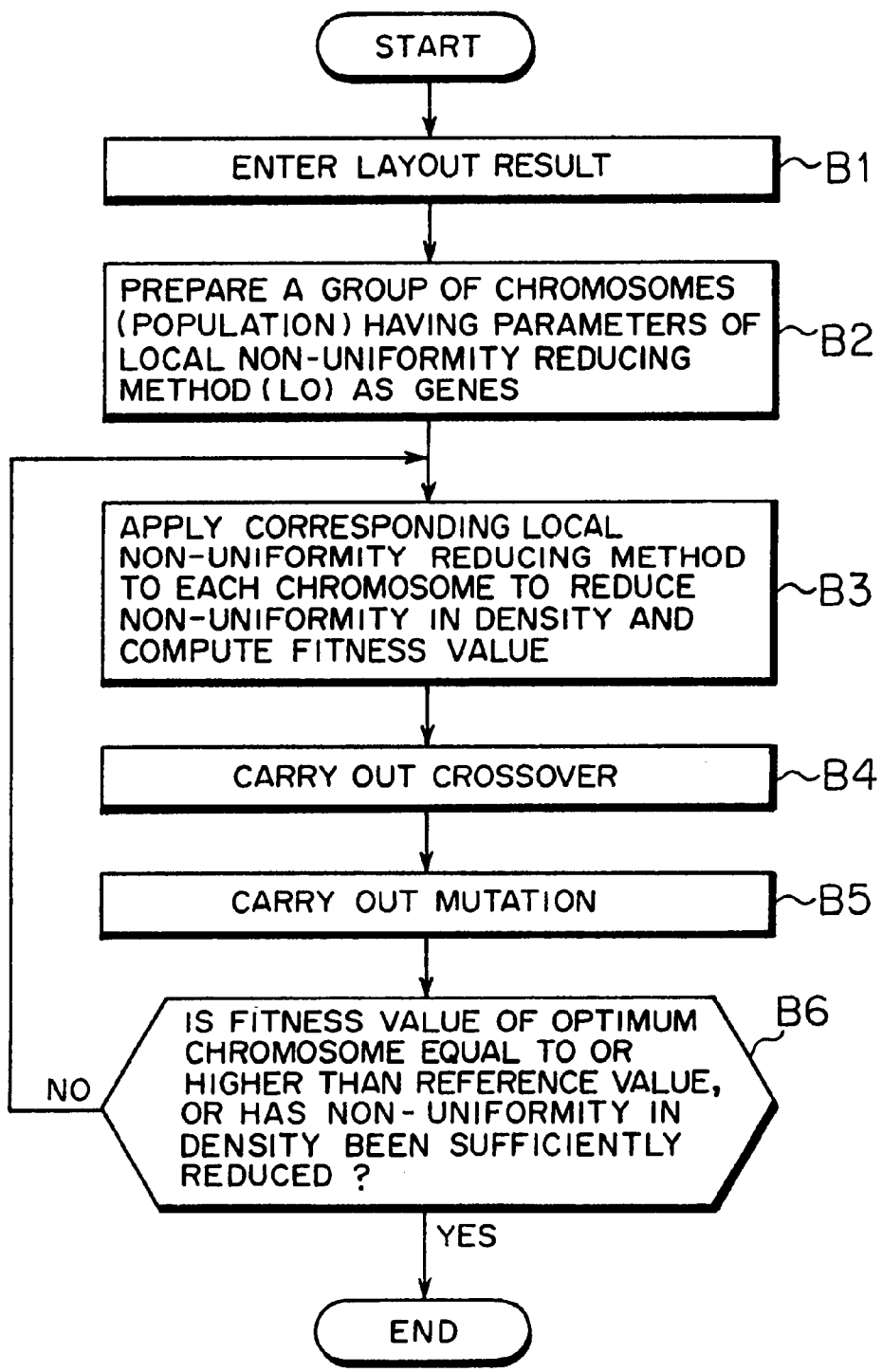
FIG. 23 is a flowchart for describing another example of the layout optimization problem processing method according to the second embodiment.

The operation of such a layout optimization problem processing system 1 will now be described by reference to a flowchart shown in FIG. 23.

First, the result of the plurality of layout elements 9 being arranged in the initial layout (i.e., the data regarding the state of the layout elements 9 arranged in the initial arrangement) is entered to the layout optimization problem processing system 1 (step B1).

Upon receipt of the initial layout result regarding the layout elements 9, in the first algorithm executing step (step B2) the layout optimization problem processing system 1 prepares a group of chromosomes which comprises genes parameters for the local layout unbalance reducing method (LO).

Subsequently, in the second algorithm executing step, an attempt is made to reduce non-uniformity in density in each of the chromosomes by means of the local layout unbalance reducing method (LO) [that is, the plurality of layout regions 10 are divided into the widths specified by individual chromosomes, and an attempt is made to reduce non-uniformity in density in each of the layout regions 10 by means of the local layout unbalance reducing method (LO)], thereby computing a fitness value (step B3). The local layout unbalance reducing method (LO) is carried out through use of the algorithm to which a hydrodynamic analogy is applied.

Subsequently, crossover and mutation are carried out as genetic operations for each of the chromosomes in the first algorithm executing step (steps B4 and B5) In this way, a determination is made as to whether or not the fitness value of the chromosome having the highest fitness value (i.e., the most optimum chromosome) is equal to or greater than a predetermined reference value, or as to whether or not non-uniformity in density of the layout elements 9 can be satisfactorily reduced when the layout regions 10 are divided into the widths determined by the chromosome having the highest fitness value (step B6).

If it is determined that the fitness value of the most optimum chromosome is not equal to or greater than the predetermined reference value or that the non-uniformity in density of the layout elements 9 is not satisfactorily reduced, the processing operations subsequent to the processing relating to step B3 are again executed (i.e., when NO is selected in step B6) In contrast, when it is determined that the fitness value of the most optimum chromosome is equal to or greater than the predetermined reference value or that the non-uniformity in density in the layout result can be satisfactorily reduced, the result of arrangement of the layout elements 9 at that time is output as a solution to the layout optimization problem. The processing by the layout optimization processing system 1 is completed (YES is selected in step B6).

Advantageous results similar to those mentioned previously may be yielded through the foregoing processing steps.

Even under the layout optimization problem processing method according to the second embodiment, as previously mentioned by reference to the first embodiment, there may be achieved use of the sequential addition method; paying consideration to a stationary layout element and a large-sized layout element; simultaneous movement of the layout elements 9; and gradual movement of the layout elements 9.

(b5) Description of Modification of the Second Embodiment

The second embodiment has described the case where the algorithm to which a hydrodynamic analogy is applied is used as the local layout unbalance reducing algorithm when the local layout unbalance reducing method (LO) is carried out in the second algorithm executing step. As in the case with the modification of the first embodiment, the previously-described algorithm to which a morphing analogy is applied may be used as the local layout unbalance reducing algorithm in the second algorithm executing step.

As mentioned above, even when the local layout unbalance reducing method (LO) is carried out by use of the algorithm to which the morphing analogy is applied, advantageous results similar to those yielded in the second embodiment may be yielded.

Even in this case, needless to say, use of the sequential addition method, consideration to the stationary layout element and the large-sized layout element, simultaneous movement of the layout elements 9, and gradual movement of the layout elements 9 can be effected, as described in connection with the first embodiment.

(b6) Description of the Third Embodiment

A layout optimization problem processing method according to a third embodiment of the present invention will now be described.

Under the layout optimization problem processing method according to the third embodiment, the genetic algorithms (GAp and GAc) and the local layout unbalance reducing method (LO) are used in combination by executing the genetic algorithm (GAc) in the first algorithm executing step (i.e., step S3 shown in FIG. 2) while the genetic algorithm (GAp) is executed, and by executing the local layout unbalance reducing algorithm in the second algorithm executing step (i.e., step S4 shown in FIG. 2).

More specifically, under the layout optimization processing method according to the third embodiment, at the time of determining an optimum solution through use of the genetic algorithm (GAp), the genetic algorithm (GAc) is executed upon creation of each generation or upon creation of a plurality of generations. Further, the local layout unbalance reducing method (LO) is carried out during execution of the genetic algorithm (GAc).

In other words, under this method, the genetic algorithm (GAc) and the local layout unbalance reducing method (LO) are inserted into the genetic algorithm (GAp) and this layout optimization problem processing method can be expressed as GAp+(GAc+LO).

Figure 24:
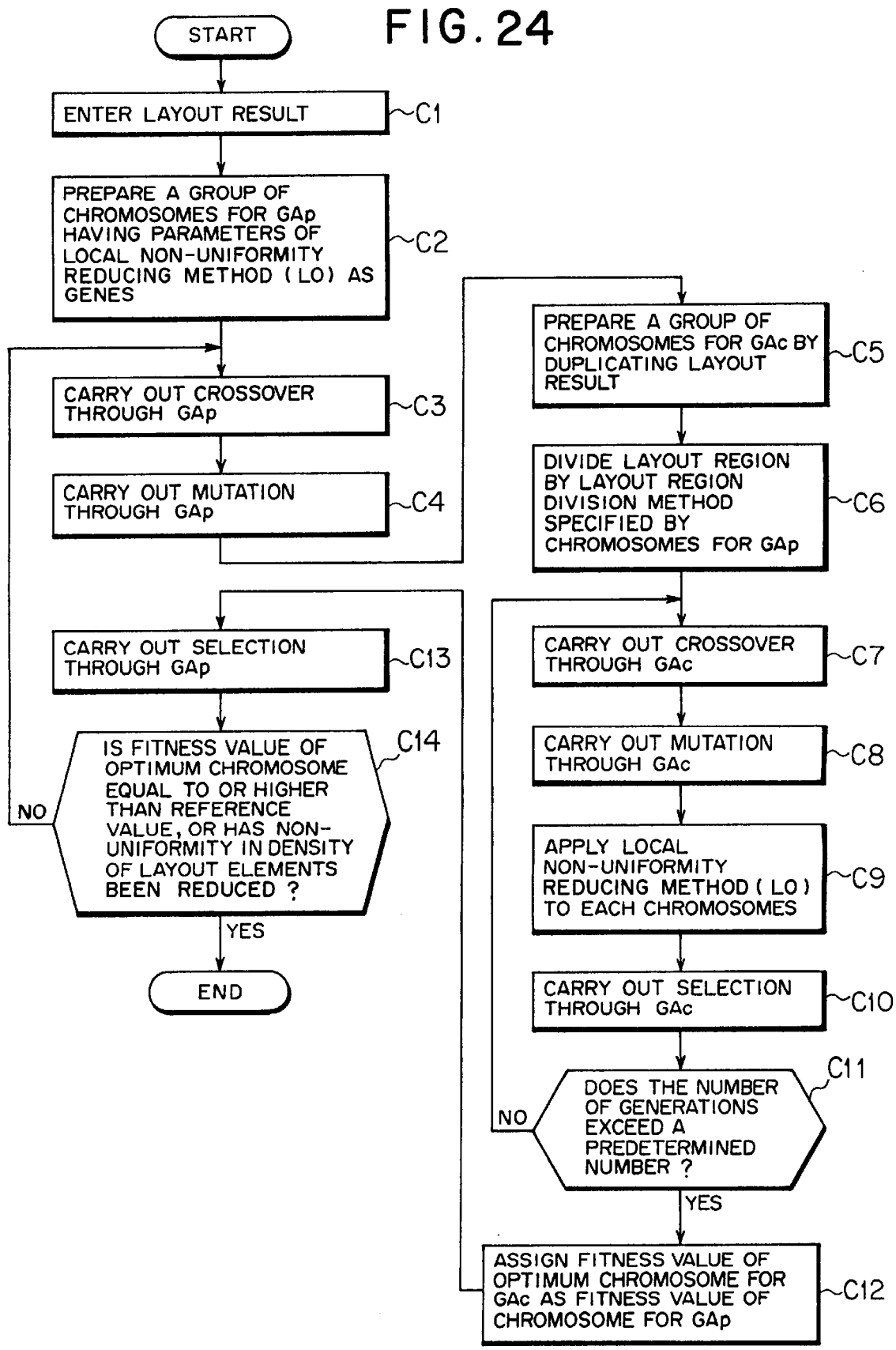
FIG. 24 is a flowchart for describing a layout optimization problem processing method according to a third embodiment of the present invention.

The operation of such a layout optimization problem processing system 1 will be described by reference to a flowchart shown in FIG. 24.

The result of initial layout of the plurality of layout elements 9 (i.e., the data regarding the state of the layout elements 9 arranged in the initial layout) is input to the layout optimization problem processing system 1 (step C1).

Upon receipt of the result of initial layout of the layout elements 9, the layout optimization problem processing system 1 prepares, in the first algorithm executing step, a group of chromosomes which comprise, as genes, the parameters for the local layout unbalance reducing method (LO) and which are based on the genetic algorithm (GAp) (step C2).

Subsequently, the individual chromosomes undergo the genetic operations effected by the genetic algorithm (GAp); i.e., crossover and mutation (steps C3 and C4).

The genetic algorithm (GAc) is executed in the first algorithm executing step during execution of the genetic algorithm (GAp), and the local layout unbalance reducing algorithm is executed in the second algorithm executing step (steps C5 to C12).

More specifically, in the first algorithm executing step, a group of chromosomes based on the genetic algorithm (GAc) is prepared by duplication of the result of initial layout of the layout elements 9 acquired in step C1 (step C5).

Under the method of dividing the layout region 10 that is specified by the plurality of chromosomes based on the genetic algorithm (GAp) [that is, according to the widths specified by the plurality of chromosomes based on the genetic algorithm (GAp)], the plurality of layout regions 10 comprising the chromosomes based on the genetic algorithm (GAc) are divided (step C6).

In the first algorithm executing step, the individual chromosomes undergo the genetic operations effected by the genetic algorithm (GAc); i.e., crossover and mutation (steps C7 and C8).

Subsequently, in the second algorithm executing step, the individual chromosomes (layout results) are subjected to local layout unbalance reducing methods (LO), which are identical with one another in terms of the manner of dividing the layout region 10 but comprise different control parameters (step C9). The local layout unbalance reducing methods (LO) are executed through use of an algorithm to which the hydrodynamic analogy is applied or an algorithm to which the morphing analogy is applied.

Further, in the first algorithm executing step, after the individual chromosomes have undergone the genetic operation of the genetic algorithm (GAc); i.e., selection (step C10), a determination is made as to whether or not the number of generations determined to undergo the genetic algorithm (GAc) has exceeded a predetermined number (step C11).

If it is determined that the number of generations has not yet exceeded a predetermined number [that is, it is determined that the genetic algorithm (GAc) has not yet been executed a number of times corresponding to the predetermined number of generations], the processing operations subsequent to the processing relating to step C7 are executed again (when NO is selected in step C11). In contrast, if it is determined that the number of generations has exceeded a predetermined number [that is, it is determined that the genetic algorithm (GAc) has been executed a number of times corresponding to the predetermined number of generations], the fitness value of the optimum chromosome based on the genetic algorithm (GAc) is taken as the fitness value of the chromosome based on the genetic algorithm (GAp) (when YES is selected in step C11, and step C12).

Subsequently, the processing again returns to the process of executing the genetic algorithm (GAp) in the first algorithm executing step, and the individual chromosomes undergo the genetic operation effected by the genetic algorithm (GAp); i.e., selection (step C13) A determination is made as to whether or not the fitness value of the chromosome having the highest fitness value (i.e., the optimum chromosome) is equal to or greater than a predetermined reference value or whether or not non-uniformity in density of the layout elements 9 has been reduced (step C14).

If it is determined that the fitness value of the optimum chromosome is not equal to or greater than the predetermined reference value or that the non-uniformity in density of the layout elements 9 has not yet been reduced, the processing procedures subsequent to the processing relating to step C3 are executed again (when NO is selected in step C14). In contrast, if it is determined that the fitness value of the optimum chromosome is equal to or greater than the predetermined reference value or that the non-uniformity in density of the layout elements 9 has already been reduced, the optimum chromosome is output as a solution to the layout optimization problem. The processing of the layout optimization problem processing system 1 is then terminated (when YES is selected in step C14).

As mentioned above, the layout optimization problem processing method according to the third embodiment yields advantageous results similar to those yielded in the previous embodiments, as well as combined execution of the genetic algorithm (GAc) and the local layout unbalance reducing method (LO) during the execution of the genetic algorithm (GAp). Therefore, the processing speed of the genetic algorithm (GAp) can be increased to a much greater extent.

(b7) Description of the Fourth Embodiment

A layout optimization problem processing method according to a fourth embodiment of the present invention will now be described.

Under the layout optimization problem processing method according to the fourth embodiment, the genetic algorithms (GAp and GAc) and the local layout unbalance reducing method (LO) are used in combination by executing the genetic algorithm (GAp) in the first algorithm executing step (i.e., step S3 shown in FIG. 2) while the genetic algorithm (GAc) is executed, and by executing the local layout unbalance reducing algorithm in the second algorithm executing step.

More specifically, under the layout optimization processing method according to the fourth embodiment, at the time of determining an optimum solution through use of the genetic algorithm (GAc), the genetic algorithm (GAp) is executed upon creation of each generation or upon creation of a plurality of generations. Further, the local layout unbalance reducing method (LO) is carried out during execution of the genetic algorithm (GAp).

As has been already described by reference to the second embodiment, under the present method, the widths into which the layout region 10 is divided are optimized through combined execution of the genetic algorithm (GAp) and the local layout unbalance reducing method (LO), and the layout region 10 that is divided to these widths is used as a chromosome for the genetic algorithm (GAc) The genetic algorithm (GAc) is executed, thereby retrieving a more efficient solution.

This layout optimization problem processing method can be expressed as GAp+(GAc+LO).

Figure 25:
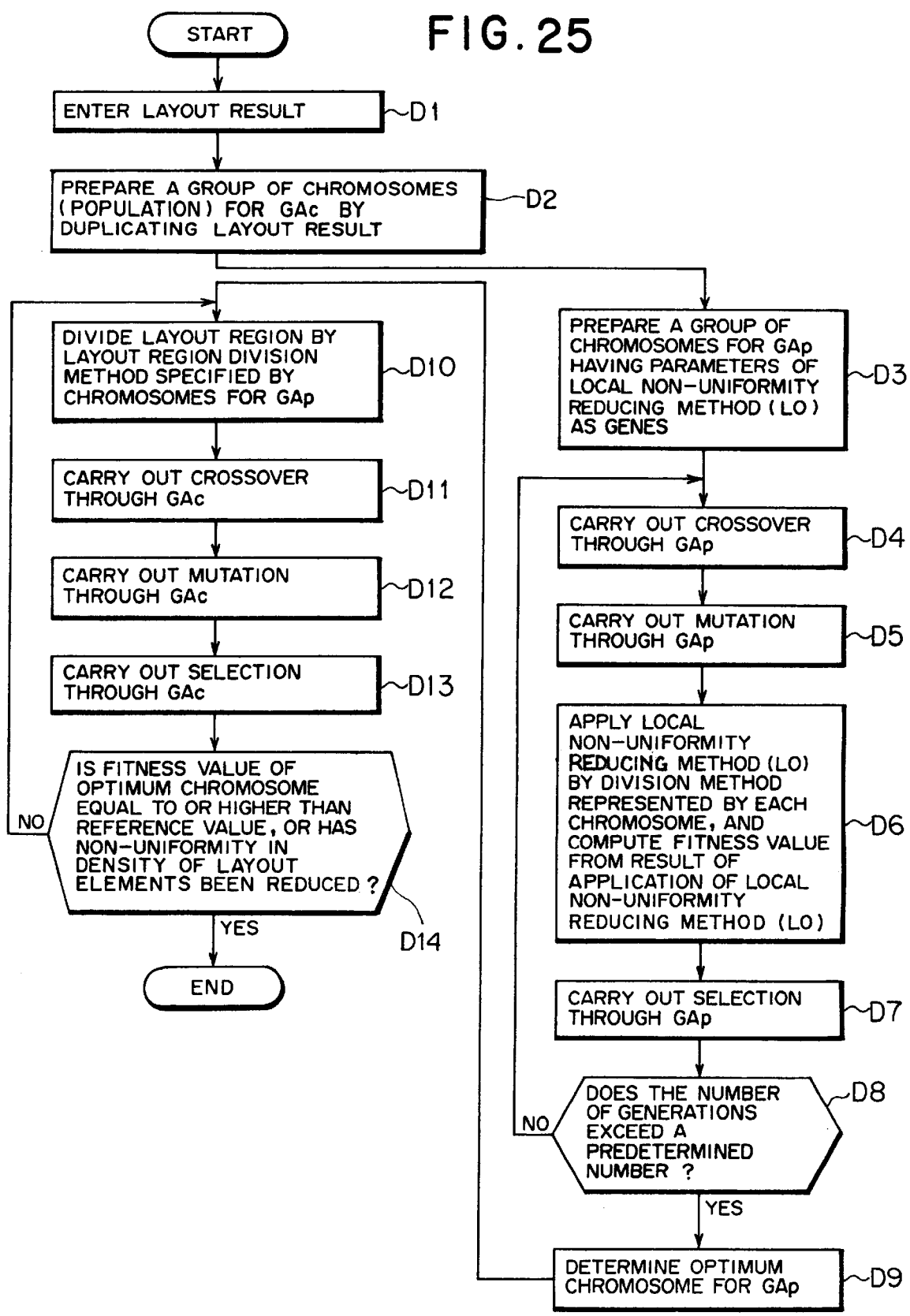
FIG. 25 is a flowchart for describing a layout optimization problem processing method according to a fourth embodiment of the present invention.

The operation of such a layout optimization problem processing system 1 will be described by reference to a flowchart shown in FIG. 25.

The result of initial layout of the plurality of layout elements 9 (i.e., the data regarding the state of the layout elements 9 staying in the initial layout) is input to the layout optimization problem processing system 1 (step D1).

Upon receipt of the result of initial layout of the layout elements 9, the layout optimization problem processing system 1 prepares, in the first algorithm executing step, a group of chromosomes based on the genetic algorithm (GAc), through duplication of the result of initial layout (step D2).

During execution of the genetic algorithm (GAc) the genetic algorithm (GAp) is executed in the first algorithm executing step. Further, the local layout unbalance reducing method (LO) is carried out in the second algorithm executing step (steps D3 to D9).

More specifically, in the first algorithm executing step, there is prepared a group of chromosomes which comprise, as genes, parameters for the local layout unbalance reducing method (LO) and which are based on the genetic algorithm (GAp) (step D3).

Subsequently, in the first algorithm executing step, the individual chromosomes undergo the genetic operations effected by the genetic algorithm (GAp); i.e., crossover and mutation (steps D4 and D5).

In the second algorithm executing step, the layout regions 10 are divided according to the widths specified by the individual chromosomes, and the-local layout unbalance reducing methods (LO) are executed, thereby attempting reduction of non-uniformity in density. A fitness value is computed from the results of the local layout unbalance reducing methods (LO) (step D6). The local layout unbalance reducing methods (LO) are executed through use of an algorithm to which a hydrodynamic analogy is applied or an algorithm to which a morphing analogy is applied.

Further, in the first algorithm executing step, the individual chromosomes undergo the genetic operation effected by the genetic algorithm (GAp); i.e., selection, whereby a chromosome having a higher optimum value is selected (step D7). Subsequently, a determination is made as to whether or not the number of generations determined to undergo the genetic algorithm (GAp) has exceeded a predetermined number (step D8).

If it is determined that the number of generations has not yet exceeded a predetermined number [that is, it is determined that the genetic algorithm (GAp) has not yet been executed a number of times correspond to the predetermined number of generations], the processing operations subsequent to the processing relating to step D4 are executed again (when NO is selected in step D8) In contrast, if it is determined that the number of generations has exceeded a predetermined number [that is, it is determined the genetic algorithm (GAp) has been executed a number of times corresponding to the predetermined number of generations], the chromosome selected in step D7 is taken as the optimum chromosome based on the genetic algorithm (GAp) (when YES is selected in step D8, and step D9).

Subsequently, the processing again returns to the process of executing the genetic algorithm (GAc) in the first algorithm executing step, the layout regions 10, which correspond to the chromosomes based on the genetic algorithm (GAc), are divided according to the method of dividing the layout regions 10 specified by the chromosomes that are based on the genetic algorithm (GAp) and are determined in step D9 [that is, according to the widths specified by the chromosomes that are based on the genetic algorithm (GAp) and are determined in step D9] (step D10).

Further, in the first algorithm executing step, the individual chromosomes undergo the genetic operations effected by the genetic algorithm (GAc); i.e., crossover, mutation, and selection (steps D11 to D13).

A determination is made as to whether or not the fitness value of the chromosome having the highest fitness value (i.e., the optimum chromosome) is equal to or greater than a predetermined reference value or whether or not non-uniformity in density of the layout elements 9 has been reduced (step D14).

If it is determined that the fitness value of the optimum chromosome is not equal to or greater than the predetermined reference value or that the non-uniformity in density of the layout elements 9 has not yet been reduced, the processing procedures subsequent to the processing relating to step D10 are again executed (when NO is selected in step D14). In contrast, if it is determined that the fitness value of the optimum chromosome is equal to or greater than the predetermined reference value or that the non-uniformity in density of the layout elements 9 has already been reduced, the optimum chromosome is output as a solution to the layout optimization problem. The processing of the layout optimization problem processing system 1 is then terminated (when YES is selected in step D14).

As mentioned above, the layout optimization problem processing method according to the fourth embodiment yields advantageous results similar to those yielded in the previous embodiments, as well as combined execution of the genetic algorithm (GAp) and the local layout unbalance reducing method (LO) during the execution of the genetic algorithm (GAc). Therefore, the processing speed of the genetic algorithm (GAc) can be increased to a much greater extent.

(b8) Others

The first, third, and fourth embodiments have described the case where all the chromosomes (i.e., the layout regions 10) split in any one of the two directions; i.e., the vertical and horizontal directions, undergo the genetic algorithm (GAc). However, chromosomes split in multiple directions may also undergo the genetic operation (GAc).

A model used in such a case is called an island model. This island model will now be described by reference to FIG. 26.

Figure 26:
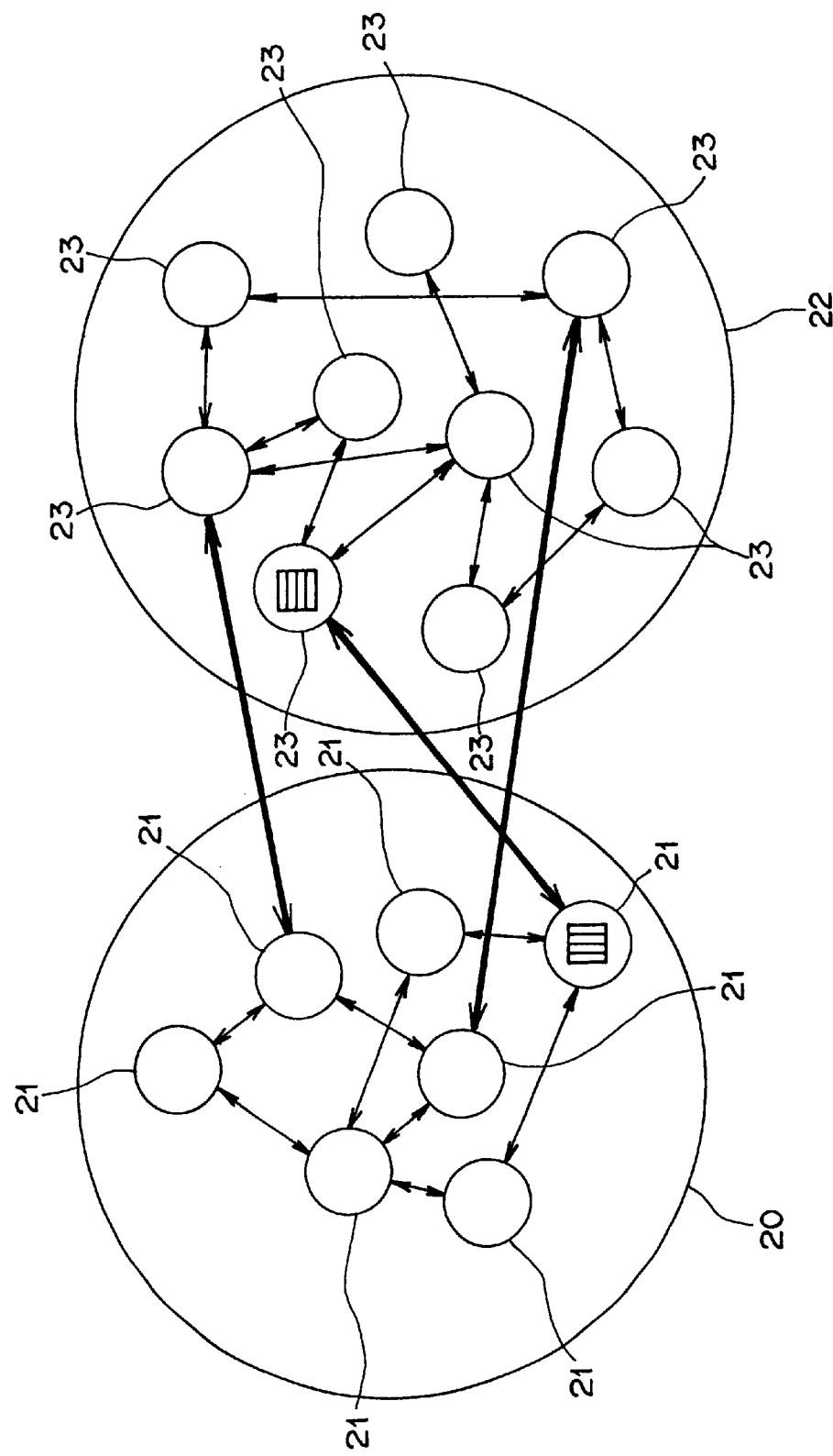
FIG. 26 shows an island model.

The island model shown in FIG. 26 comprises a first island 20 having a group of vertically-split chromosomes 21 and a second island 22 having a group of horizontally-split chromosomes 23.

Here, the first island 20 is required to comprise only one chromosome group 21, and the second island 23 is required to comprise only one chromosome group 22.

In the first algorithm executing step, the genetic algorithm (GAc) is executed by use of the first island 20 and the second island 22. Here, the first island 20 comprises at least one chromosome group 21, and the chromosome group 21 includes a plurality of sub-divided regions 10, or a plurality of strip regions, formed by vertically dividing the layout region 10 on which the plurality of layout elements 9 are to be arranged. Further, the second island 22 comprises at least one chromosome group 23, and the chromosome group 23 includes a plurality of sub-divided regions 10, or a plurality of strip regions, formed by horizontally dividing the layout region 10 on which the plurality of layout elements 9 are to be arranged.

The chromosome groups 21 and 23 usually evolve independently according to the genetic algorithm (GAc) and the local layout unbalance reducing method (LO). Alternatively, every time the genetic algorithm (GAc) is executed an appropriate number of repetitions, a chromosome may be selected from one chromosome group 21 of the first island 20 in some way, and a chromosome may be selected from one chromosome group 23 of the second island 22 in some way. The thus-selected chromosomes, which are divided in multiple directions, may be taken as parent chromosomes. The parent chromosomes may undergo the genetic operation; i.e., crossover, thereby generating child chromosomes. The child chromosomes may be returned to the chromosome groups (populations) 21 and 23, respectively.

Crossover between the chromosomes, which are divided in multiple directions, may be effected in the following manner.

(1) First Crossover Method

The chromosomes selected from the chromosome group 21 are in a vertically-split state. When the chromosomes undergo the local layout unbalance reducing method (LO) certain layout elements 9 are moved over only a predetermined distance and in a predetermined direction within the strip region to which the layout elements 9 pertain. The distance over which the layout elements 9 are moved is taken as vector $x_1'$.

The chromosomes selected from the chromosome group 23 are in a horizontally-split state. When the chromosomes undergo the local layout unbalance reducing method (LO)., certain layout elements 9 are moved over only a predetermined distance and it a predetermined direction within the strip region to which the layout elements 9 pertain. The distance over which the layout elements 9 are moved is taken as vector $x_2'$.

The distance over which the layout elements 9 are moved is determined as a resultant vector $x_1'+x_2'$. In each of the parent chromosomes, the layout elements 9 are moved over only a distance corresponding to the resultant vector. The chromosome selected from the chromosome group 21 and the chromosome selected from the chromosome group 23 are subjected to crossover, thereby generating child chromosomes. The thus-generated child chromosomes are returned to the chromosome groups 21 and 23, respectively.

In the first algorithm executing step, at the time of execution of the genetic algorithm (GAc), the chromosome pertaining to the first island 20 is subjected to the local layout unbalance reducing method (LO), and the chromosome pertaining to the second island 22 is also subjected to the local layout unbalance reducing method (LO), thereby moving the certain layout elements 9 within the individual regions of the chromosomes. In each of the chromosomes pertaining to the first and second islands 20 and 22, the sum of vectors relating to the distances over which the certain layout elements 9 are moved is obtained. The certain layout elements 9 are moved within the individual chromosomes according to the resultant vector, thereby effecting crossover as a genetic operation between the chromosome pertaining to the first island 20 and the chromosome pertaining to the second island 22.

(2) Second Crossover Method

The chromosome selected from the chromosome group (populations) 21 comprises vertically-split strip regions. These strip regions are intentionally read as horizontally-split strip regions and incorporated into the chromosome selected from the chromosome group 23. The chromosome selected from the chromosome group 21 and the chromosome group selected from the chromosome group 23 are subjected to crossover, thereby generating child chromosomes.

For example, layout elements $9_1$ to $9_3$ are arranged in a certain strip region among the vertically-split strip regions that are included in the chromosome selected from the chromosome group 21. First, a strip region corresponding to the strip region including the layout elements $9_1$ to $9_3$ is retrieved from the chromosome that is selected from the chromosome group 23 and comprises horizontally-split strip regions.

Assuming that, as a result of retrieval of the corresponding strip region from the chromosome that comprises horizontally-split strip regions, the layout elements $9_1$ and $9_2$ are found to be included in a certain strip region of the horizontally-split strip regions, and the layout element $9_3$ is found to be included in another strip region. Further, another layout element $9_4$ is also found to be included in the strip region that includes the layout elements $9_1$ and $9_2$.

In the chromosome comprising the horizontally-split strip regions, the layout element $9_4$ included in the strip region that includes the layout elements $9_1$ and $9_2$ is intentionally read as the layout element $9_3$. Further, the layout element $_{93}$ included in another strip region is also intentionally read as the layout element $9_4$. As a result, the vertically-split strip region can be read as a horizontally-split strip region.

Similarly, the chromosome selected from the chromosome group 21 and the chromosome selected from the chromosome group 23 may be subjected to crossover by intentionally reading, as vertically-split strip regions, the strip regions included in the chromosome that is selected from the chromosome group 23 and by incorporation of these vertically-split regions into the chromosome selected from the chromosome group 21.

Specifically, in the first algorithm executing step, during execution of the genetic algorithm (GAc) a strip region including a certain layout element 9 is extracted from the chromosome pertaining to the first island 20 (or the second island 22). The thus-extracted strip region is intentionally read as a strip region of the chromosome pertaining to the second island 22 (or the first island 20). As a result, the chromosome pertaining to the first island 20 and the chromosome pertaining to the second island 22 are subjected to the genetic operation; i.e., crossover.

Figure 27:
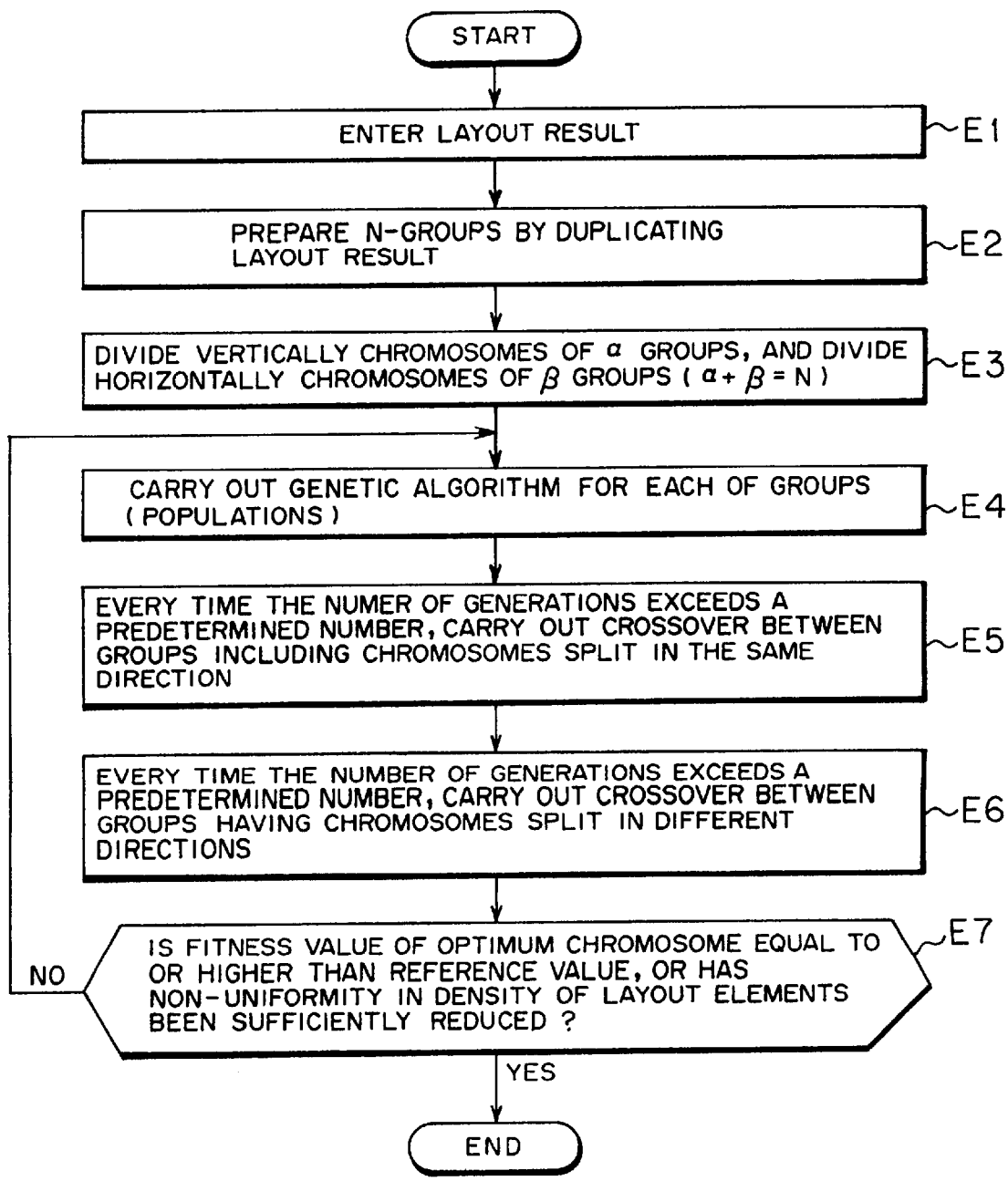
FIG. 27 is a flowchart for describing a layout optimization problem processing method employing the island model.

The operation of such a layout optimization problem processing system 1 will now be described by reference to FIG. 27.

The result of initial layout of the plurality of layout elements 9 (i.e., the data regarding the state of the layout elements 9 arranged in the initial layout) is input to the layout optimization problem processing system 1 (step E1).

Upon receipt of the result of initial layout of the layout elements 9, the layout optimization problem processing system 1 prepares, in the first algorithm executing step, N groups of chromosomes based on the genetic algorithm (GAc) through duplication of the result of initial layout (step E2).

Next, in the first algorithm executing step, the N groups are divided into α groups and β groups (where α+β=N). Chromosomes included in the β groups are vertically split, thereby creating the first island 20 comprising α-groups 21, each of which includes vertically-split chromosomes. Chromosomes included in the β groups are horizontally split, thereby creating the second island 22 comprising β groups 22, each of which includes horizontally-split chromosomes (step E3).

In the first algorithm executing step, the genetic algorithm (GAc) is executed independently in each of the chromosome groups 21 and 23 (step E4).

During execution of the genetic algorithm (GAc), every time the number of generations crosses a predetermined number, crossover is effected between the groups of chromosomes split in the same direction (step E5). More specifically, the chromosome pertaining to one chromosome group 21 and the chromosome pertaining to another chromosome group 21 are subjected to crossover within the first island 20. In the second island 22, the chromosome pertaining to one chromosome group 23 and the chromosome pertaining to another chromosome group 23 are subjected to crossover.

Every time the number of generations exceeds a predetermined number, crossover is effected among the chromosome groups that include chromosomes split in multiple directions (step E6). Specifically, the chromosome included in the chromosome group 21 pertaining to the first island 20 and the chromosome included in the chromosome group 23 pertaining to the second island 22 are subjected to crossover. At this time, the individual chromosomes are also subjected to the local layout unbalance reducing method (LO).

A determination is made as to whether or not the fitness value of the chromosome having the highest fitness value (i.e., the optimum chromosome) is equal to or greater than a predetermined reference value or whether or not non-uniformity in density of the layout elements 9 has been reduced (step E7).

If it is determined that the fitness value of the optimum chromosome is not equal to or greater than the predetermined reference value or that non-uniformity in density of the layout elements 9 is not reduced, the processing procedures subsequent to the processing relating to step E4 are again executed (when NO is selected in step E7). In contrast, if it is determined that the fitness value of the optimum chromosome is equal to or greater than the predetermined reference value or that non-uniformity in density of the layout elements 9 has been reduced, the optimum chromosome is output as a solution to the layout optimization problem. The processing of the layout optimization problem processing system 1 is then terminated (when YES is selected in step E7).

As mentioned above, so long as there is employed the island model which effects crossover between the groups of chromosomes split into multiple directions, the diversity of chromosomes which are candidate solutions and are included in the chromosome groups 21 and 23 can be maintained. Therefore, an optimum solution can be efficiently retrieved, and non-uniformity in density of the layout elements 9 can be reduced more efficiently.

The first through fourth embodiments have described the case where a fixed algorithm (e.g., an algorithm to which a hydrodynamic analogy is applied or an algorithm to which a morphing analogy is applied) is used in the second algorithm executing step at the time of executing the local layout unbalance reducing method (LO) during execution of the genetic algorithms (GAc and GAp). Desirably, the algorithm used in the second algorithm executing step is changed for each generation. Further, the local layout unbalance reducing method (LO) maybe changed from one chromosome to another chromosome.

Further, the local layout unbalance reducing method (LO) may be carried out in the second algorithm executing step while the layout region 10 is not split.

Further, mutation may be carried out by execution of the genetic algorithms (GAc and GAp) in the first algorithm executing step while the chromosome (i.e., the layout region 10) is not split.

A specific example of a layout optimization problem to which the present invention can apply will now be described.

(1) Problem of Layout of Cells During LSI Design

A cell has dimensions, and the requirement that cells should not overlap one another is imposed on the layout of cells.

In principle, an optimum cell layout may be obtained by non-linear programming (e.g., a hill-climbing method) in consideration of the aforementioned constraint. However, in the case of a cell layout optimization problem of practical scale, efficient determination of an optimum cell layout is usually difficult.

For this reason, an optimum cell layout may be determined more efficiently by finding a cell layout [see FIG. 28(*a*)] by non-linear programming without consideration of the constraint, and by reducing non-uniformity in density of the cells according to a method such as that described with reference to the present invention [see FIG. 28 (*b*)].

(2) Floor Plan

A floor plan is one type of LSI layout problem and relates to a problem, wherein the area of cells to be placed is predetermined and the side lengths of the cells are changeable.

Figures 29A, 29B:
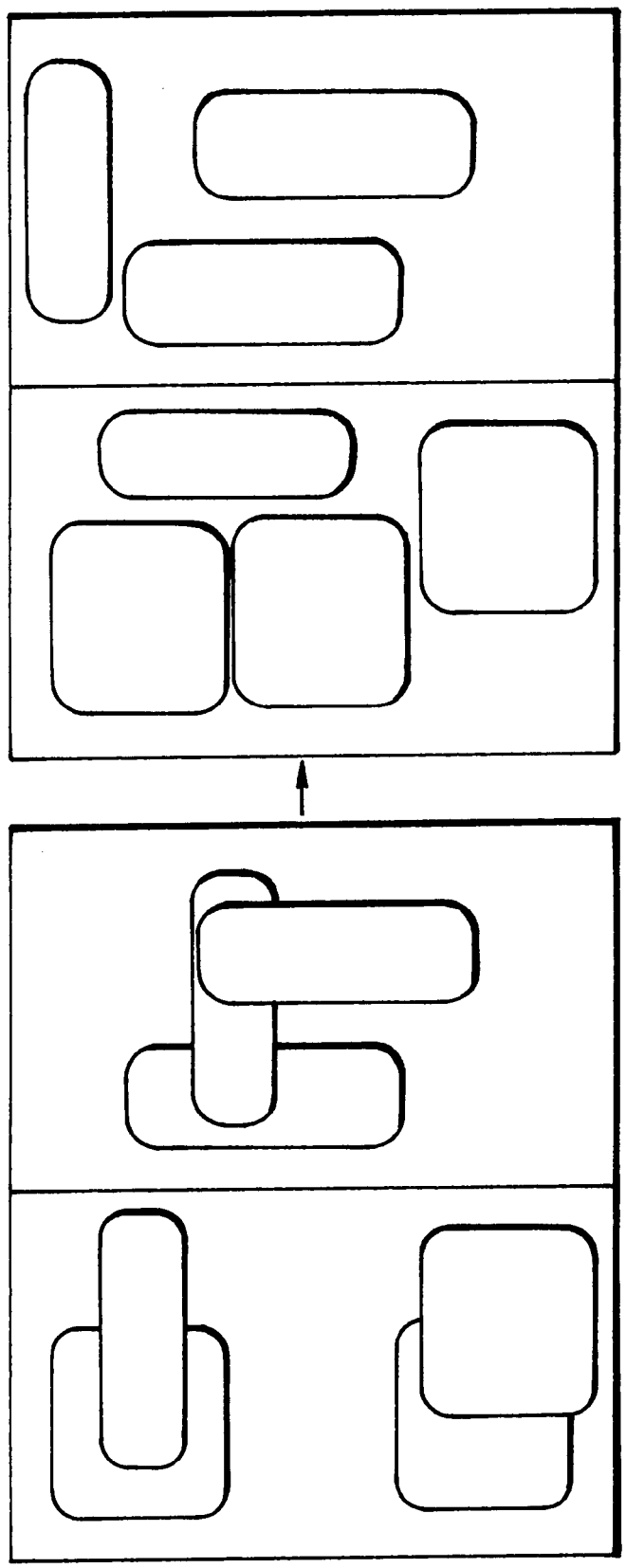
FIGS. 29(a) and 29(b) show an example of application of the present invention to a floor plan.

Even in such a problem, non-uniformity in density in the cell layout can be reduced by use of a method such as that described by reference to the present invention [see FIGS. 29(*a*) and 29(*b*)].

What is claimed is:

1. A method of processing a layout optimization problem in which it is requested to find the optimal layout on a predetermined layout space for a plurality of elements that ought to be subjected to a predetermined connection relationship, comprising:

executing, when first information concerning the plurality of elements staying in an initial condition is available, a genetic algorithm based on the first information reducing non-uniformity in density of the plurality of elements and bringing the plurality of elements into a layout unbalance reduction halfway stage; and executing, when second information concerning the plurality of elements staying in the layout unbalance reduction halfway stage is available, a local layout unbalance reducing algorithm, that moves one or more elements from a high-density location to a low-density location within each of a plurality of local sub-spaces of the predetermined layout space, based on the second information, further reducing the non-uniformity in density of the plurality of elements staying in the layout unbalance reduction halfway stage.

2. A method of processing a layout optimization problem as defined in claim 1, wherein the genetic algorithm is executed by expressing the layout states of the plurality of elements as genes, and by using, as a candidate solution for a problem of arranging the plurality of elements within the space, a chromosome which comprises a sequence of the genes and is defined as the space.

3. A method of processing a layout optimization problem as defined in claim 2, wherein, at the time of execution of the genetic algorithm, crossover is carried out as a genetic operation by dividing the space, within which the plurality of elements are to be arranged, into a plurality of sub-divided spaces, thereby dividing the chromosome into a plurality of regions; and by exchanging at least one region selected from the plurality of regions in the chromosome with a counterpart portion in another chromosome.

4. A method of processing a layout optimization problem as defined in claim 2, wherein, at the time of execution of the genetic algorithm, crossover is carried out as a genetic operation by dividing the space within which the plurality of elements are to be arranged into a plurality of sub-divided spaces, thereby dividing the chromosome into a plurality of regions; and by pasting a specific region of the plurality of regions within the chromosome to a counterpart portion region of another chromosome if the specific region is found to have lower non-uniformity in density than that of the counterpart region.

5. A method of processing a layout optimization problem as defined in claim 2, wherein, at the time of execution of the genetic algorithm, mutation is carried out as a genetic operation by dividing the space, in which the plurality of elements are to be arranged, into a plurality of sub-divided spaces, thereby dividing the chromosome into a plurality of regions; and by moving at least one of the plurality of elements within its respective regions.

6. A method of processing a layout optimization problem as defined in claim 2, wherein, at the time of execution of the genetic algorithm, selection is carried out as a genetic operation by use of a fitness function which enables a chromosome having lower non-uniformity in density of the plurality of elements to assume a great fitness value.

7. A method of processing a layout optimization problem as defined in claim 2, wherein a first island and a second island are used in said genetic algorithm executing; the first island comprising at least one chromosome group (population); the chromosome group including a plurality of sub-divided regions formed by vertically dividing the space in which the plurality of elements are to be arranged; the second island comprising at least one chromosome group; and the chromosome group including a plurality of sub-divided regions formed by horizontally dividing the space within which the plurality of elements are to be arranged.

8. A method of processing a layout optimization problem as defined in claim 7, wherein the chromosome group of the first island and the chromosome group of the second island are subjected to a genetic operation, i.e., crossover, in said genetic algorithm executing, at the time of execution of the genetic algorithm; by applying the local layout unbalance reducing algorithm to the chromosome group of the first island and to the chromosome group of the second island to thereby move at least one specific element within each of the regions of the chromosome groups; and by moving the specific element within each of the chromosome groups according to the sum of vectors over which the specific element of the first island and the specific element of the second island are moved.

9. A method of processing a layout optimization problem as defined in claim 7, wherein the chromosome group of the first island and the chromosome group of the second island are subjected to a genetic operation, i.e., crossover, in said genetic algorithm executing, at the time of execution of the genetic algorithm; by extraction of a region including a specific element from the chromosome group of either the first or second island; by reading the thus-extracted region as a counterpart region of the chromosome group of the other island; and by inserting the region into the other island.

10. A method of processing a layout optimization problem as defined in claim 1, wherein, when the space within which the plurality of elements are to be arranged is divided into a plurality of sub-divided spaces, non-uniformity in density of the plurality of elements within each of the sub-divided spaces is reduced.

11. A method of processing a layout optimization problem as defined in claim 1, wherein elements to be subjected to reduction of non-uniformity in density are sequentially added in said executing the local layout unbalance reducing algorithm when non-uniformity in density of the plurality of elements staying in the layout unbalance reduction halfway stage is further reduced.

12. A method of processing a layout optimization problem as defined in claim 1, wherein, if a stationary element which cannot be moved exists among the plurality of elements, the stationary element is read as an element capable of undergoing reduction of non-uniformity in density in said executing the local layout unbalance reducing algorithm, and non-uniformity in density of the plurality of elements staying in the layout unbalance reduction halfway stage is further reduced.

13. A method of processing a layout optimization problem as defined in claim 1, wherein, if a large element accounting for a larger proportion of the space than any of the other elements exists among the plurality of elements, the distance over which the large element is moved is reduced in said executing the local layout unbalance reducing algorithm, and non-uniformity in density of the plurality of elements staying in the layout unbalance reduction halfway stage is further reduced.

14. A method of processing a layout optimization problem as defined in claim 1, wherein the elements to be moved are simultaneously moved in said executing the local layout unbalance reducing algorithm at the time of reduction of non-uniformity in density of the plurality of elements staying in the layout unbalance reduction halfway stage.

15. A method of processing a layout optimization problem as defined in claim 1, wherein the elements to be moved are moved gradually in said executing the local layout unbalance reducing algorithm at the time of reduction of non-uniformity in density of the plurality of elements staying in the layout unbalance reduction halfway stage.

16. A method of processing a layout optimization problem in which it is requested to find the optimal layout on a predetermined layout space for a plurality of elements that ought to be subjected to a predetermined connection relationship, comprising:
   executing a genetic algorithm; and
   executing a local layout unbalance reducing algorithm, that moves one or more elements from a high-density location to a low-density location within each of a plurality of local sub-spaces of the predetermined layout space;

wherein said genetic algorithm executing is performed so as to determine the optimum value of a parameter utilized upon executing the local layout unbalance reducing algorithm, reducing non-uniformity in density of the plurality of elements staying in an initial layout.

17. A method of processing a layout optimization problem as defined in claim 16, wherein, the parameter utilized upon executing the local layout unbalance reducing algorithm is expressed as a gene, and a chromosome comprising a sequence of the gene is used as a candidate solution for a problem of determining the parameter, thereby executing the genetic algorithm.

18. A method of processing a layout optimization problem as defined in claim 17, wherein, when the space within which the plurality of elements are to be arranged is divided into a plurality of sub-divided spaces, the parameter comprises information for specifying the sizes of the sub-divided spaces.

19. A method of processing a layout optimization problem as defined in claim 18, wherein when the genetic algorithm is executed, a weighted average between genes of two parent chromosomes is taken as a gene of a child chromosome, thereby effecting crossover as a genetic operation.

20. A method of processing a layout optimization problem as defined in claim 18, wherein when the genetic algorithm is executed, a portion of the chromosome is pasted to a counterpart portion of another chromosome while the total sum of data for specifying the sizes of the sub-divided spaces included in the parameter is controlled so as to become unchanged, thereby effecting crossover as a genetic operation.

21. A method of processing a layout optimization problem as defined in claim 18, wherein when the genetic algorithm is effected, at least two genes of the chromosome are selected, and an arbitrary numerical value is added to the thus-selected genes so as not to change the total sum of data for specifying the size of the sub-divided spaces included in the parameter, thereby effecting mutation as a genetic operation.

22. A method of processing a layout optimization problem as defined in claim 18, wherein when the genetic algorithm is executed, selection is effected as a genetic operation by use of a fitness function which enables a chromosome capable of reducing non-uniformity in density of the plurality of elements to assume a high fitness value.

23. A method of processing a layout optimization problem as defined in claim 16, wherein, when the space within which the plurality of elements are to be arranged is divided into a plurality of sub-divided spaces, non-uniformity in density of the plurality of elements within each of the sub-divided spaces is reduced.

24. A method of processing a layout optimization problem as defined in claim 16, wherein elements to be subjected to reduction of non-uniformity in density are sequentially added in said executing the local layout unbalance reducing algorithm when non-uniformity in density of the plurality of elements staying in the layout unbalance reduction halfway stage is further reduced.

25. A method of processing a layout optimization problem as defined in claim 16, wherein, if a stationary element which cannot be moved exists among the plurality of elements, the stationary element is read as an element capable of undergoing reduction of non-uniformity in density in said executing the local layout unbalance reducing algorithm, and non-uniformity in density of the plurality of elements staying in the layout unbalance reduction halfway stage is further reduced.

26. A method of processing a layout optimization problem as defined in claim 16, wherein, if a large element accounting for a larger proportion of the space than any of the other elements exists among the plurality of elements, the distance over which the large element is moved is reduced in said executing the local layout unbalance reducing algorithm, and non-uniformity in density of the plurality of elements staying in the layout unbalance reduction halfway stage is further reduced.

27. A method of processing a layout optimization problem as defined in claim 16, wherein the elements to be moved are simultaneously moved in said executing the local layout unbalance reducing algorithm at the time of reduction of non-uniformity in density of the plurality of elements staying in the layout unbalance reduction halfway stage.

28. A method of processing a layout optimization problem as defined in claim 16, wherein the elements to be moved are moved gradually in said executing the local layout unbalance reducing algorithm at the time of reduction of non-uniformity in density of the plurality of elements staying in the layout unbalance reduction halfway stage.

29. A method of processing a layout optimization problem, in which it is requested to find the optimal layout on a predetermined layout space for a plurality of elements that ought to be subjected to a predetermined connection relationship, comprising:

executing a genetic algorithm when information concerning the plurality of elements staying in an initial condition is available so that non-uniformity in density of the plurality of elements is reduced to bring the plurality of elements into a layout unbalance reduction halfway stage; and executing a local layout unbalance reducing algorithm when information concerning the plurality of elements staying in the layout unbalance reduction halfway stage is available, whereby the non-uniformity in density of the plurality of elements staying in the layout unbalance reduction halfway stage is further reduced, and wherein an algorithm to which a hydrodynamic analogy is applied is used as the local layout unbalance reducing algorithm.

30. A method of processing a layout optimization problem as defined in claim 29, wherein the algorithm to which a hydrodynamic analogy is applied is executed in said executing the local layout unbalance reducing algorithm by moving at least one of the plurality of elements staying in the layout unbalance reduction halfway stage from a high-density location to a low-density location.

31. A method of processing a layout optimization problem as defined in claim 30, wherein, when the space within which the plurality of elements are to be arranged is divided into a plurality of sub-divided spaces, at least one of the plurality of elements included in the sub-divided space is moved from a high-density location to a low-density location within each sub-divided space in said executing the local layout unbalance reducing algorithm.

32. A method of processing a layout optimization problem as defined in claim 30, wherein at least one of the plurality of elements is moved in said executing the local layout unbalance reducing algorithm while the proximal relationship among the plurality of elements is conserved.

33. A method of processing a layout optimization problem as defined in claim 30, wherein at least one of the plurality of elements is moved in said executing the local layout unbalance reducing algorithm while the relative positional relationship among the plurality of elements is conserved.

34. A method of processing a layout optimization problem, in which it is requested to find the optimal layout on a predetermined layout space for a plurality of elements that ought to be subjected to a predetermined connection relationship, comprising:

executing a genetic algorithm; and executing a local layout unbalance reducing algorithm;

wherein executing the genetic algorithm and executing the local layout unbalance reducing algorithm are combined to calculate the optimum value of a parameter utilized upon executing the local layout unbalance reducing algorithm, whereby non-uniformity in density of the plurality of elements staying in the initial layout is reduced, and wherein an algorithm to which a hydrodynamic analogy is applied is used as the local layout unbalance reducing algorithm.

35. A method of processing a layout optimization problem as defined in claim 34, wherein the algorithm to which a hydrodynamic analogy is applied is executed in said executing the local layout unbalance reducing algorithm by moving at least one of the plurality of elements staying in the layout unbalance reduction halfway stage from a high-density location to a low-density location.

36. A method of processing a layout optimization problem as defined in claim 35, wherein, when the space within which the plurality of elements are to be arranged is divided into a plurality of sub-divided spaces, at least one of the plurality of elements included in the sub-divided space is moved from a high-density location to a low-density location within each sub-divided space in said executing the local layout unbalance reducing algorithm.

37. A method of processing a layout optimization problem as defined in claim 35, wherein at least one of the plurality of elements is moved in said executing the local layout unbalance reducing algorithm while the proximal relationship among the plurality of elements is conserved.

38. A method of processing a layout optimization problem as defined in claim 35, wherein at least one of the plurality of elements is moved in said executing the local layout unbalance reducing algorithm while the relative positional relationship among the plurality of elements is conserved.

39. A method of processing a layout optimization problem, in which it is requested to find the optimal layout on a predetermined layout space for a plurality of elements that ought to be subjected to a predetermined connection relationship, comprising:

executing a genetic algorithm when information concerning the plurality of elements staying in an initial condition is available so that non-uniformity in density of the plurality of elements is reduced to bring the plurality of elements into a layout unbalance reduction halfway stage; and executing a local layout unbalance reducing algorithm when information concerning the plurality of elements staying in the layout unbalance reduction halfway stage is available, whereby the non-uniformity in density of the plurality of elements staying in the layout unbalance reduction halfway stage is further reduced, and wherein an algorithm to which a morphing analogy is applied is used as the local layout unbalance reducing algorithm.

40. A method of processing a layout optimization problem as defined in claim 39, wherein the algorithm to which a morphing analogy is applied is executed in said executing the local layout unbalance reducing algorithm by determining the center of morphing on the basis of the information concerning the plurality of elements staying in the layout unbalance reduction halfway stage, and by moving at least one of the plurality of elements to a location distant from the center of morphing.

41. A method of processing a layout optimization problem as defined in claim 40, wherein, when the space within which the plurality of elements are to be arranged is divided into a plurality of sub-divided spaces, determining the center of morphing for each of the sub-divided spaces and moving at least one of the plurality of elements included in each subdivided space to a location distant from the center of morphing within the sub-divided space are carried out in said executing the local layout unbalance reducing algorithm.

42. A method of processing a layout optimization problem as defined in claim 40, wherein, when at least one of the plurality of elements is moved from the center of morphing to a distant location in said executing the local layout unbalance reducing algorithm, the distance between the center of morphing and the element to be moved is linearly enlarged.

43. A method of processing a layout optimization problem as defined in claim 40, wherein, when at least one of the plurality of elements is moved from the center of morphing to a distant location in said executing the local layout unbalance reducing algorithm, the distance between the center of morphing and the element to be moved is non-linearly enlarged.

44. A method of processing a layout optimization problem, in which it is requested to find the optimal layout on a predetermined layout space for a plurality of elements that ought to be subjected to a predetermined connection relationship, comprising:

executing a genetic algorithm; and executing a local layout unbalance reducing algorithm;

wherein executing the genetic algorithm and executing the local layout unbalance reducing algorithm are combined to calculate the optimum value of a parameter utilized upon executing the local layout unbalance reducing algorithm, whereby non-uniformity in density of the plurality of elements staying in the initial layout is reduced, and wherein an algorithm to which a morphing analogy is applied is used as the local layout unbalance reducing algorithm.

45. A method of processing a layout optimization problem as defined in claim 44, wherein the algorithm to which a morphing analogy is applied is executed in said executing the local layout unbalance reducing algorithm by determining the center of morphing on the basis of the information concerning the plurality of elements staying in the layout unbalance reduction halfway stage, and by moving at least one of the plurality of elements to a location distant from the center of morphing.

46. A method of processing a layout optimization problem as defined in claim 45, Wherein, when the space within which the plurality of elements are to be arranged is divided into a plurality of sub-divided spaces, determining the center of morphing for each of the sub-divided spaces and moving at least one of the plurality of elements included in each sub-divided space to a location distant from the center of morphing within the sub-divided space are carried out in said executing the local layout unbalance reducing algorithm.

47. A method of processing a layout optimization problem as defined in claim 45, wherein, when at least one of the plurality of elements is moved from the center of morphing to a distant location in said executing the local layout unbalance reducing algorithm, the distance between the center of morphing and the element to be moved is linearly enlarged.

48. A method of processing a layout optimization problem as defined in claim 45, wherein, when at least one of the plurality of elements is moved from the center of morphing to a distant location in said executing the local layout unbalance reducing algorithm, the distance between the center of morphing and the element to be moved is non-linearly enlarged.

49. A method of processing a layout optimization problem in which it is requested to find the optimal layout on a predetermined layout space for a plurality of elements that ought to be subjected to a predetermined connection relationship, comprising:

executing a genetic algorithm; and executing a local layout unbalance reducing algorithm, that moves one or more elements from a high density location to a low-density location within each of a plurality of local sub-spaces of the predetermined layout space;

wherein said executing the genetic algorithm and said executing the local layout unbalance reducing algorithm cooperate to reduce non-uniformity in density of the plurality of elements staying in an initial layout.

50. A method of processing a layout optimization problem as defined in claim 49, wherein, in said genetic algorithm executing, the layout states of the plurality of elements are expressed as genes, and a chromosome which comprises a sequence of the genes and is defined as the space is used as a candidate solution for the problem of arranging the plurality of elements in the space, whereby the local layout unbalance reducing algorithm is executed in said executing the local layout unbalance reducing algorithm during execution of the genetic algorithm.

51. A method of processing a layout optimization problem as defined in claim 49, wherein, in said genetic algorithm executing, a parameter utilized upon executing the local layout unbalance reducing algorithm is expressed as a gene, and a chromosome comprising a sequence of the gene is used as a candidate solution for a problem of determining the parameter, whereby the local layout unbalance reducing algorithm is executed in said executing the local layout unbalance reducing algorithm during execution of the genetic algorithm.

52. A method of processing a layout optimization problem as defined in claim 49, wherein, in said genetic algorithm executing, a parameter used for executing the local layout unbalance reducing algorithm is expressed as a gene; a chromosome comprising a sequence of the gene is used as a candidate solution for a problem of determining the parameter; the layout states of the plurality of elements are expressed as genes; and a chromosome which comprises a sequence of the genes and is defined as the space is used as a candidate solution for the problem of arranging the plurality of elements in entire space, whereby the local layout unbalance reducing algorithm is executed in said executing the local layout unbalance reducing algorithm during execution of the genetic algorithm.

53. A method of processing a layout optimization problem as defined in claim 49, wherein, in said genetic algorithm executing, the layout states of the plurality of elements are expressed as genes; a chromosome which comprises a sequence of the genes and is defined as the space is used as a candidate solution for the problem of arranging the plurality of elements in the space; a parameter utilized upon executing the local layout unbalance reducing algorithm is expressed as a gene; and a chromosome comprising a sequence of the gene is used as a candidate solution for a problem of determining the parameter, whereby the local layout unbalance reducing algorithm is executed in said executing the local layout unbalance reducing algorithm during execution of the genetic algorithm.

54. A computer-readable recording medium on which is recorded a layout optimization problem processing program for causing a computer to process a layout optimization problem in which it is requested to find the optimal layout on a predetermined layout space for a plurality of elements that ought to be subjected to a predetermined connection relationship, wherein the program causes the computer to act as:

first algorithm execution means for executing, when first information concerning the plurality of elements staying in an initial condition is available, a genetic algorithm based on the first information so that non-uniformity in density of the plurality of elements is reduced to bring the plurality of elements into a layout unbalance reduction halfway stage; and second algorithm execution means for executing, when information concerning the plurality of elements staying in the layout unbalance reduction halfway stage is available, a local layout unbalance reducing algorithm, that moves one or more elements from a high-density location to a low-density location within each of a plurality of local sub-spaces of the predetermined layout space, based on the second information so that the non-uniformity in density of the plurality of elements staying in the layout unbalance reduction halfway stage is further reduced.

55. A computer-readable recording medium on which is recorded a layout optimization problem processing program for causing a computer to process a layout optimization problem in which it is requested to find the optimal layout on a predetermined layout space for plurality of elements that ought to be subjected to a predetermined connection relationship, wherein the program causes the computer to act as:

first algorithm execution means for executing a genetic algorithm; and second algorithm execution means for executing a local layout unbalance reducing algorithm, that moves one or more elements from a high-density location to a low-density location within each of a plurality of local sub-spaces of the predetermined layout space;

wherein said first algorithm execution means is operable to execute the genetic algorithm so as to determine the optimum value of a parameter utilized upon executing the local layout unbalance reducing algorithm by said second algorithm executing means, so that non-uniformity in density of the plurality of elements staying in an initial layout is reduced.

56. A computer-readable recording medium on which is recorded a layout optimization problem processing program for causing a computer to process a layout optimization problem in which it is requested to find the optimal layout on a predetermined, layout space for a plurality of elements that ought to be subjected to a predetermined connection relationship, wherein the program causes the computer to act as:

first algorithm execution means for executing a genetic algorithm; and second algorithm execution means for executing a local layout unbalance reducing algorithm, that moves one or more elements from a high-density location to a low-density location within each of a plurality of local sub-spaces of the predetermined layout space;

wherein said first algorithm executing means and said second algorithm executing means cooperate to reduce non-uniformity in density of the plurality of elements staying in an initial layout.

* * * * *